(12) United States Patent
Lim

(10) Patent No.: US 7,651,899 B2
(45) Date of Patent: Jan. 26, 2010

(54) FABRICATING METHOD FOR THIN FILM TRANSISTOR ARRAY SUBSTRATE AND THIN FILM TRANSISTOR ARRAY SUBSTRATE USING THE SAME

(75) Inventor: Byoung Ho Lim, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 166 days.

(21) Appl. No.: 11/636,605

(22) Filed: Dec. 11, 2006

(65) Prior Publication Data

US 2007/0166894 A1 Jul. 19, 2007

(30) Foreign Application Priority Data

Dec. 29, 2005 (KR) .................. 10-2005-0133548

(51) Int. Cl.
*H01L 21/00* (2006.01)
*H01L 21/84* (2006.01)

(52) U.S. Cl. .................. 438/158; 438/151; 438/155; 257/E21.414

(58) Field of Classification Search .............. 438/30, 438/151, 155, 158; 257/59, 72, E21.414; 349/141
See application file for complete search history.

(56) References Cited

U.S. PATENT DOCUMENTS

| 6,177,970 | B1 | 1/2001 | Kim |
| 2002/0186330 | A1 | 12/2002 | Kawasaki |
| 2004/0183978 | A1 | 9/2004 | Jeoung |
| 2004/0257510 | A1* | 12/2004 | Chae ................ 349/141 |
| 2005/0077524 | A1* | 4/2005 | Ahn et al. ................ 257/72 |
| 2005/0078246 | A1* | 4/2005 | Yoo et al. ................ 349/122 |
| 2005/0078264 | A1* | 4/2005 | Yoo et al. ................ 349/152 |
| 2005/0263768 | A1* | 12/2005 | Ahn ................ 257/72 |

FOREIGN PATENT DOCUMENTS

CN 1637593 A 7/2005

OTHER PUBLICATIONS

M. Akiyama et al.; "An a-Si TFT with a New Light-Shield Structure and its Application to Active-Matrix Liquid Crystal Displays", Electronic Devices Meeting, 1988; Technical Digest, Dec. 11, 1988; pp. 268-271.

* cited by examiner

*Primary Examiner*—Shouxiang Hu
(74) *Attorney, Agent, or Firm*—McKenna Long & Aldridge LLP

(57) ABSTRACT

A method of fabricating a thin film transistor array substrate and a thin film transistor array substrate using the same is disclosed. Picture quality deterioration may be prevented.

6 Claims, 23 Drawing Sheets

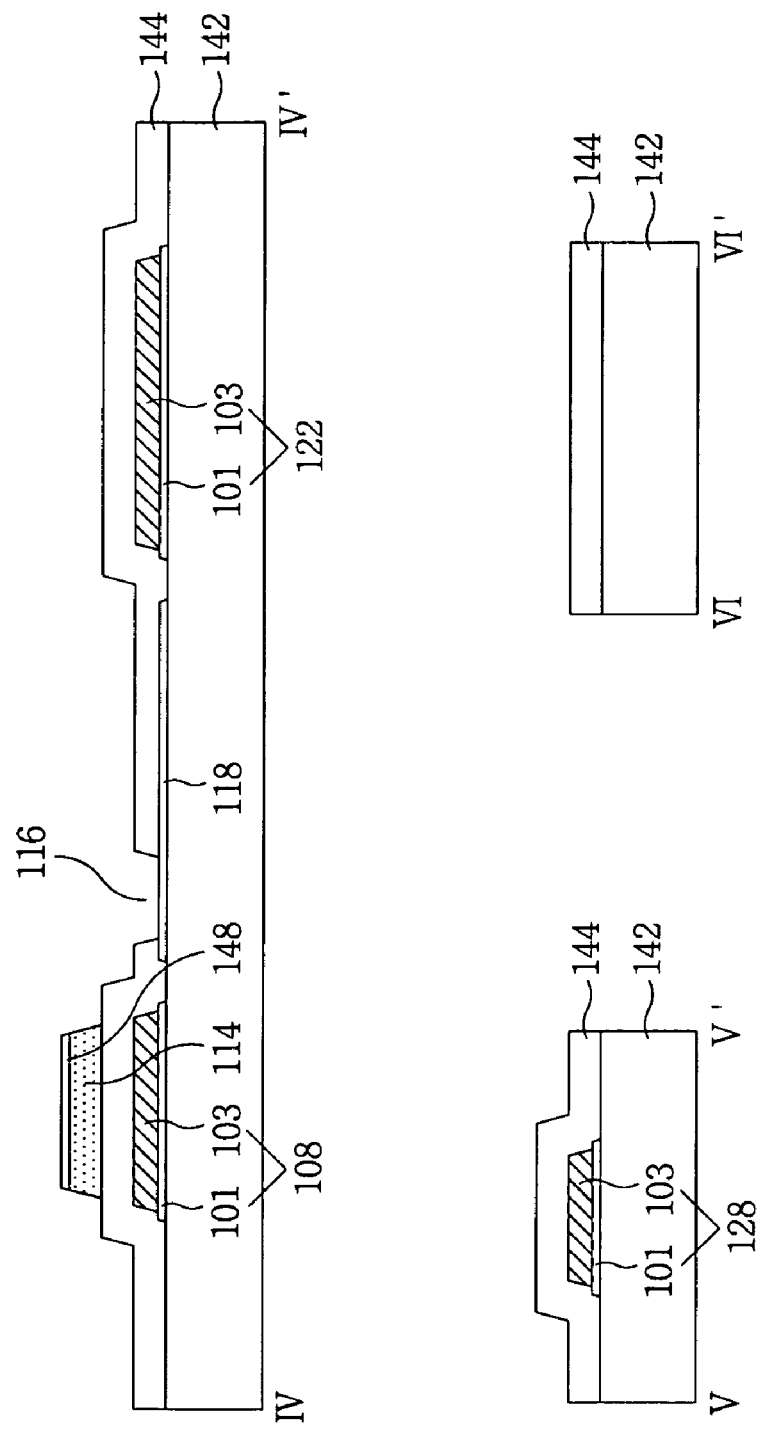

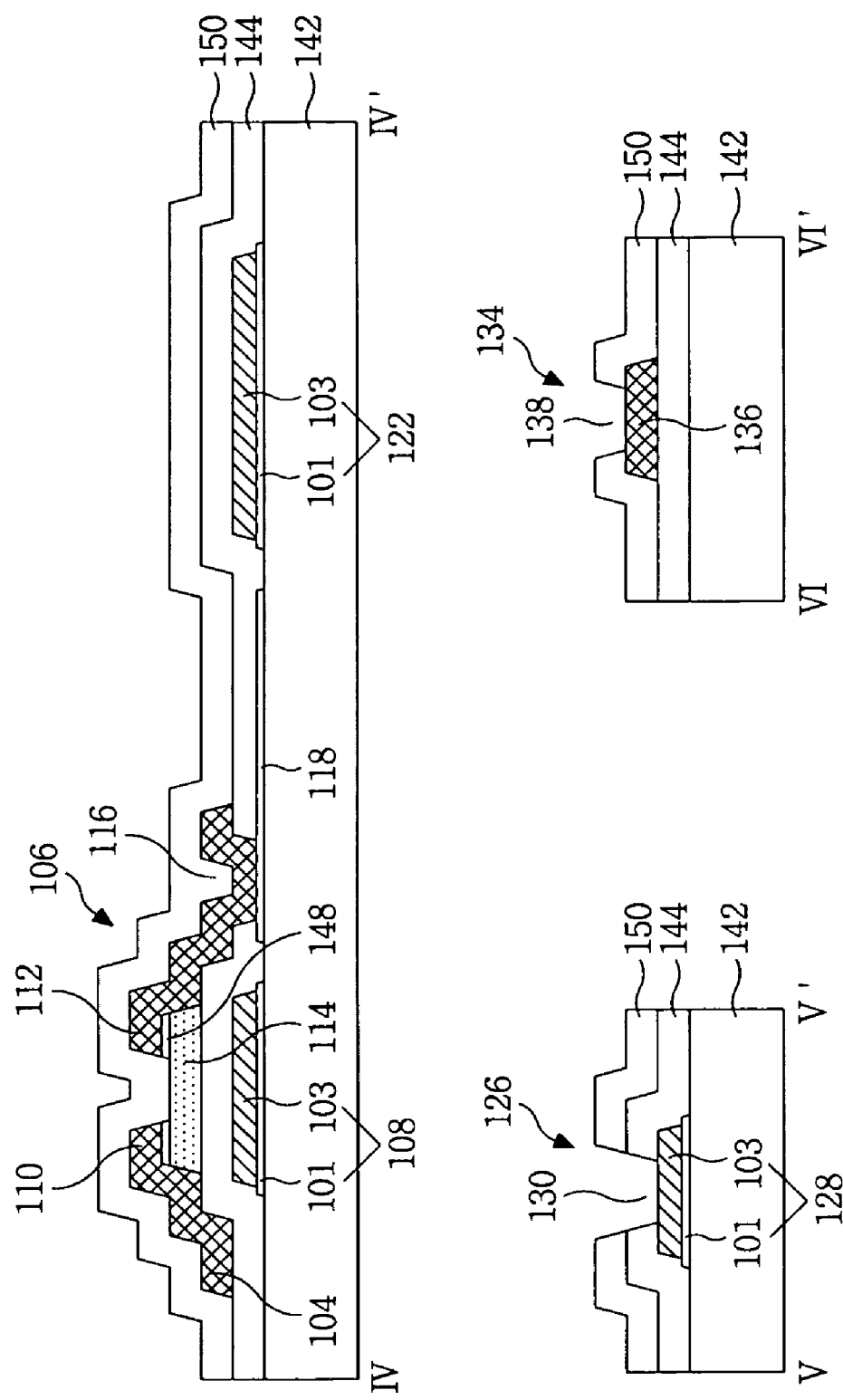

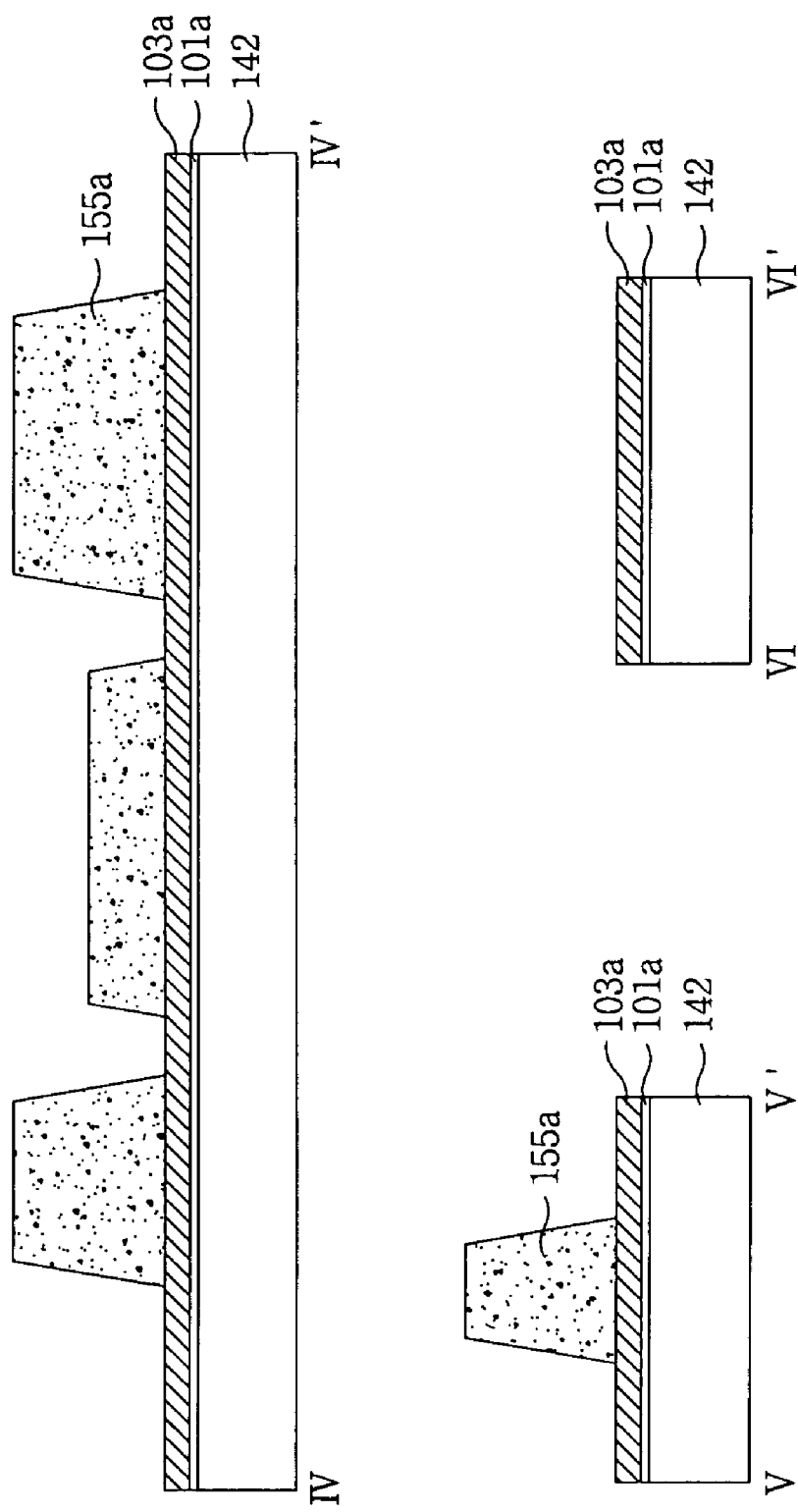

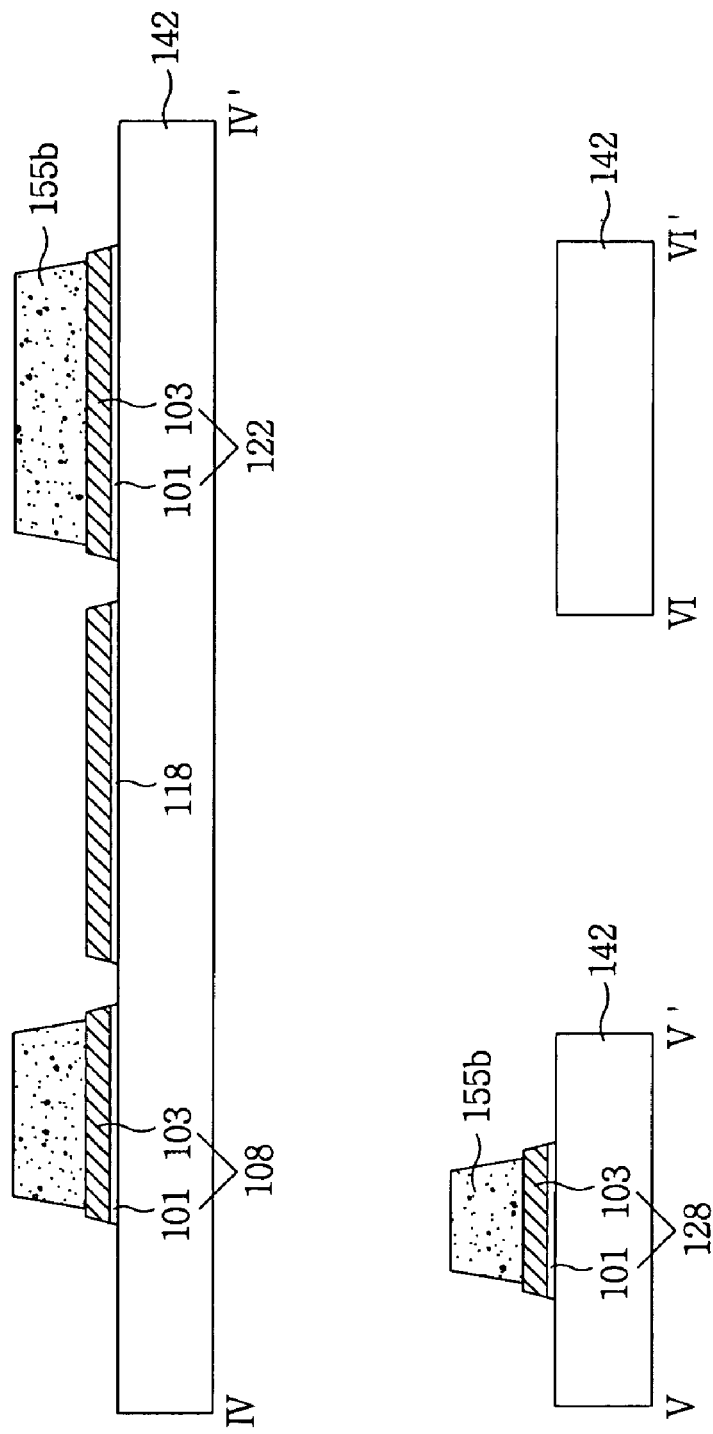

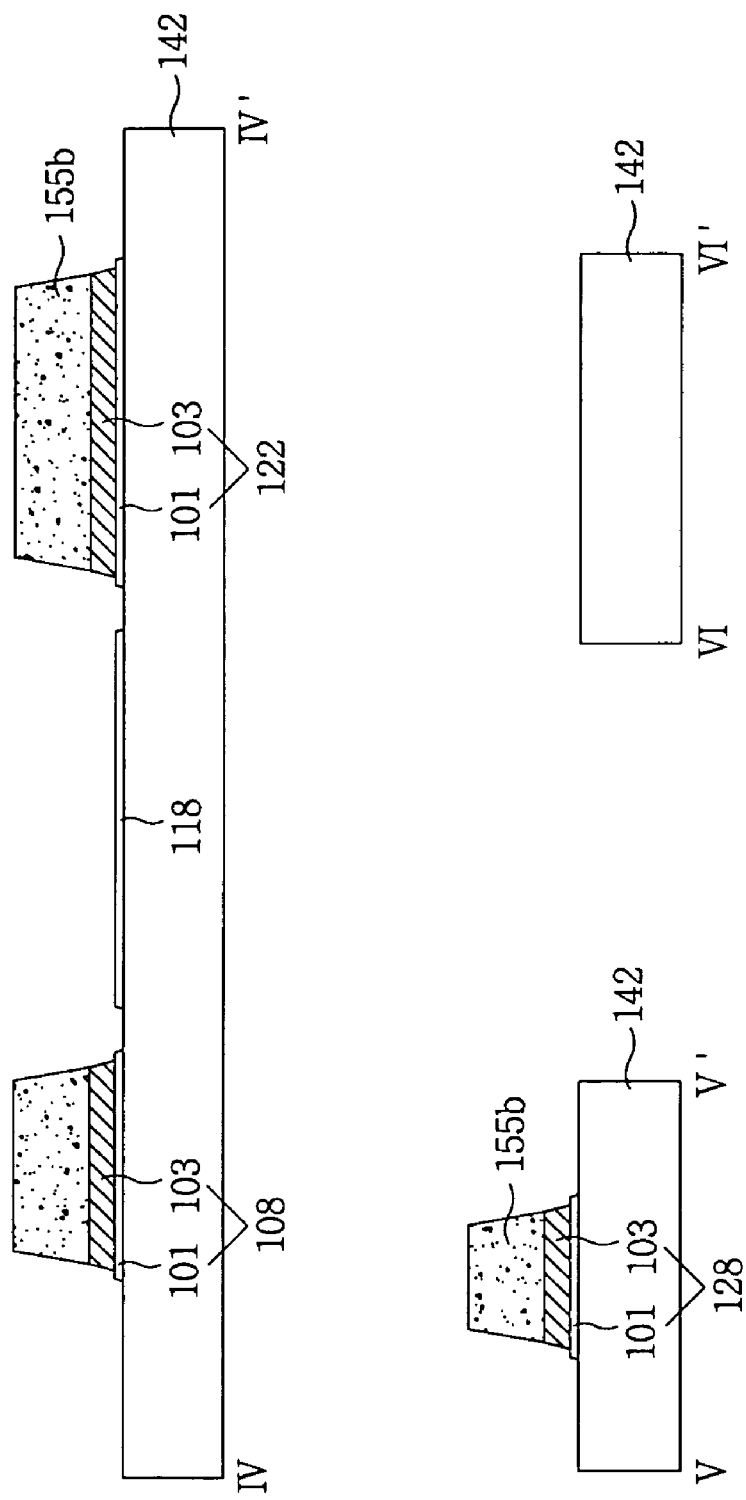

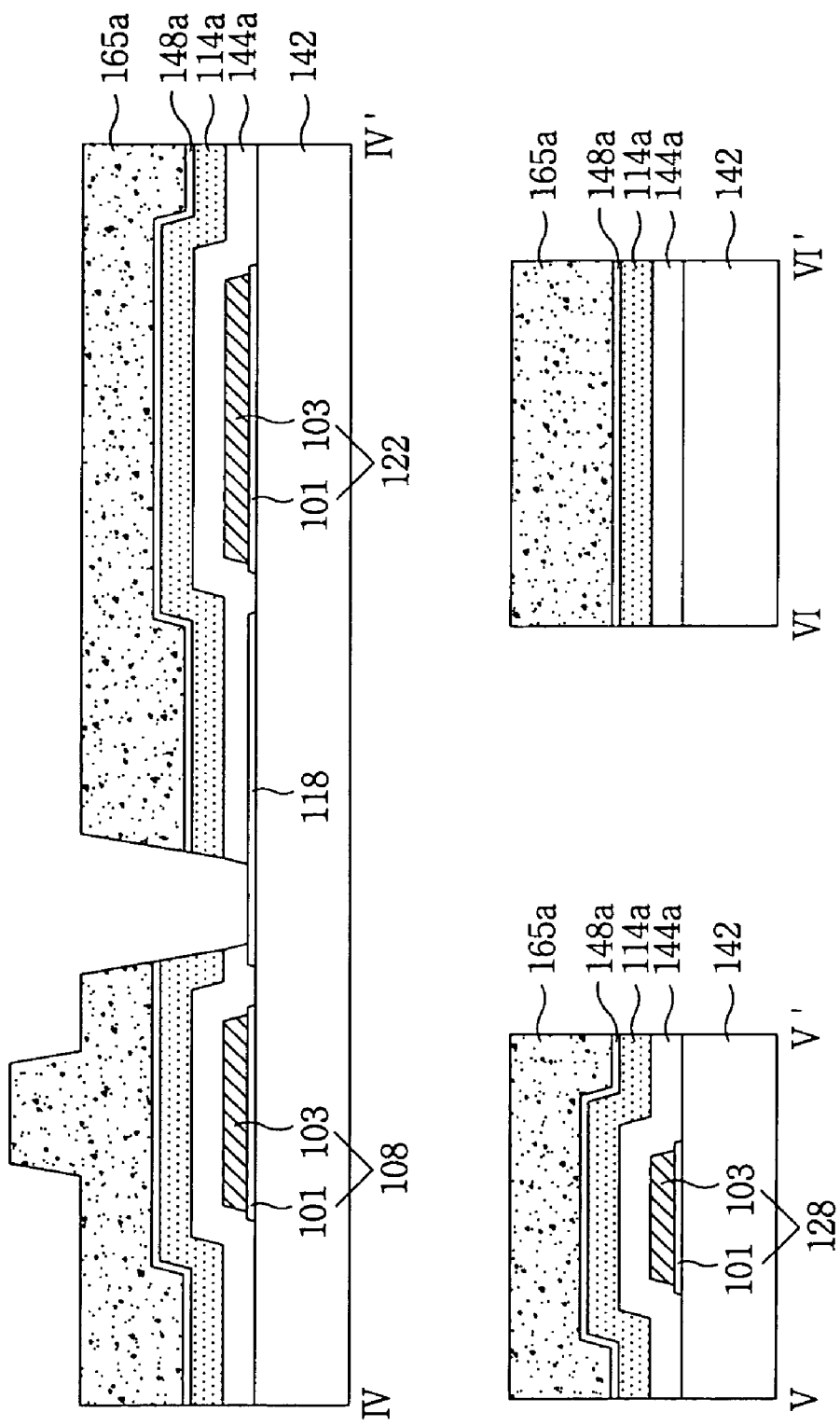

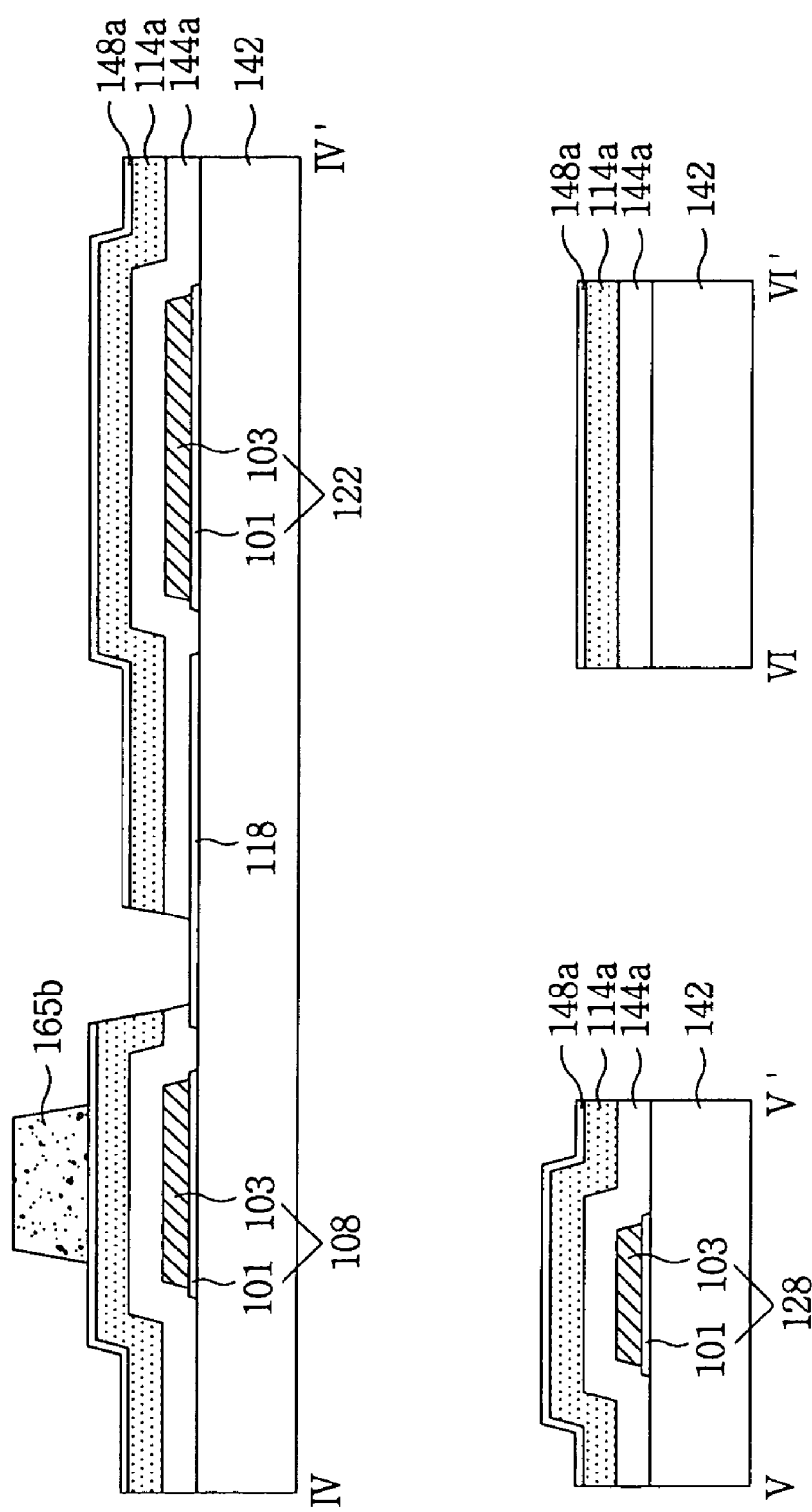

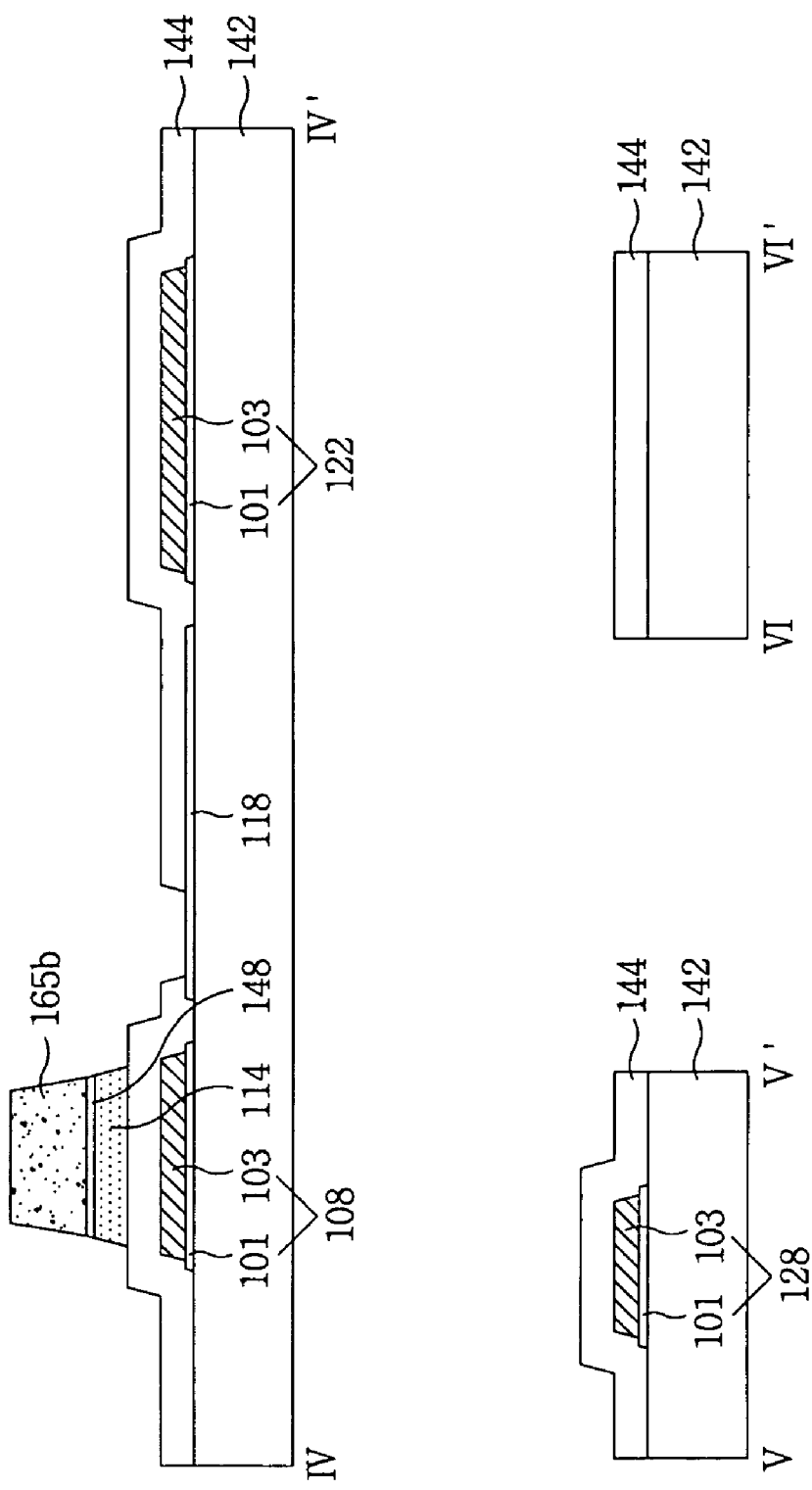

FABRICATING METHOD FOR THIN FILM TRANSISTOR ARRAY SUBSTRATE AND THIN FILM TRANSISTOR ARRAY SUBSTRATE USING THE SAME

This application claims the benefit of Korean Patent Application No. P2005-0133548, filed on Dec. 29, 2005, which is hereby incorporated by reference for all purposes as if fully set forth herein.

BACKGROUND OF THE INVENTION

1. Field of the Invention

The present invention relates to a fabricating method for thin film transistor array substrate and thin film transistor array substrate using the same, and more particularly, to a method of fabricating a thin film transistor array substrate and a thin film transistor array substrate using the same that may prevent picture quality degradation.

2. Discussion of the Related Art

A liquid crystal display device controls the light transmittance of liquid crystal matter using an electric field to thereby display a picture. Liquid crystal display devices may be classified into a vertical electric field type and a horizontal electric field type depending upon the direction of the electric field driving the liquid crystal.

The vertical electric field type drives liquid crystal in a TN (Twisted Nematic) mode with a vertical electric field occurring between a pixel electrode and a common electrode which oppose each other on upper and lower substrates. The vertical electric field type advantageously has large aperture ratio but has a narrow viewing angle of about 90°.

The horizontal electric field type drives liquid crystal in an In Plane Switching (hereinafter, referred to as "IPS") mode with a horizontal electric field occurring between the pixel electrode and the common electrode arranged in parallel to each other on the lower substrate. The liquid crystal display device of IPS mode has an advantage of a wide viewing angle of about 160°.

Hereinafter, the liquid crystal display device of horizontal electric field type will be described in detail as follows.

FIG. 1 is a plan view showing a thin film transistor array substrate of a related art liquid crystal display device of horizontal electric field type, and FIG. 2 is a cross sectional view of the thin film transistor array substrate taken along the lines I-I', II-II' and III-III' in FIG. 1.

Referring to FIG. 1 and FIG. 2, the thin film transistor (hereinafter, referred to as "TFT") array substrate of the related art liquid crystal display device of horizontal electric field type comprises a gate line 2 and a data line 4 provided on a lower substrate 42 in such a manner to intersect each other with a gate insulating film 44 therebetween, a TFT 6 provided at each intersection of the gate line 2 and the data line 4, a pixel electrode 18 and a common electrode 22 formed in such a manner to provide a horizontal electric field at a pixel area having a crossing structure of the gate line 2 and the data line 4, and a common line 20 connected to a common electrode 22. The TFT array substrate further includes a gate pad 26 connected to the gate line 2 and a data pad 34 connected to the data line 4.

The TFT 6 includes a gate electrode 8 connected to the gate line 2, a source electrode 10 connected to the data line 4, a drain electrode 12 connected to a pixel electrode 18 and an active layer 14 for forming a channel between the source electrode 10 and the drain electrode 12. The active layer 14 may overlap with a lower data pad electrode 36, the data line 4, the source electrode 10 and the drain electrode 12. An ohmic contact layer 48 for making ohmic contact with the source electrode 10 and the drain electrode 12 is further formed on the active layer 14. Such a thin film transistor 6 allows a pixel voltage signal applied to the data line 4 to be charged into the pixel electrode 18 and kept in response to a gate signal applied to the gate line 2.

The pixel electrode 18 is connected, via a first contact hole 16 passing through a protective film 50, to the drain electrode 12 of the TFT 6. Such a pixel electrode 18 may comprise a first and second horizontal portion 18a and 18b connected to the drain electrode 12 and substantially parallel to the adjacent gate line 2, and a finger portion 18c formed between the first horizontal portion 18a and the second horizontal portion 18b.

The common line 20 is substantially parallel to the gate line 2 and supplies a reference voltage for driving of a liquid crystal to the common electrode 22.

The common electrode 22 may be comprised of a horizontal portion 24a substantially parallel to the common line 20, and a vertical portion 22b substantially between the horizontal portion 24a and the common line 20 and provides a horizontal electric field along with the finger portion 18c of the pixel electrode 18.

Accordingly, if a pixel voltage signal is supplied, via the TFT, to the pixel electrode 18 and a reference voltage is supplied, via the common line 20, to the common electrode 22, then a horizontal electric field is formed between the finger portion 18c of the pixel electrode 18 and the vertical portion 22b of the common electrode 22. This liquid crystal display device rotates liquid crystal molecules positioned between the thin film transistor array substrate and the color filter array substrate owing to a dielectric anisotropy and transmits light inputted, via the pixel electrode 18, from a back light (not shown) toward the upper substrate to thereby display a picture.

The gate line 2 is connected, via a gate pad 26, to a gate driver (not shown). The gate pad 26 is comprised of a lower gate pad electrode 28 extending from the gate line 2 and an upper gate pad electrode 32 connected, via a second contact hole 30 passing through the gate insulating film 44 and the protective film 50, to the lower gate pad electrode 28.

The data line 4 is connected, via a data pad 34, to a data driver (not shown). The data pad 34 is comprised of a lower data pad electrode 36 extending from the data line 4 and an upper data pad electrode 40 connected, via a third contact hole 38 passing through the protective film 50, to the lower data pad electrode 36.

The TFT array substrate having such a structure is formed by a four-round mask process. This will be schematically described as follows.

First, gate patterns including the gate line 2, the gate electrode 8, the lower gate pad electrode 28, the common line 20 and the common electrode 22 are formed in a first mask process. A semiconductor pattern including the active layer 14 and the ohmic contact layer 48, and source/drain patterns such as the lower data pad electrode 36 and the source/drain electrodes 10 and 12, etc., are sequentially formed on the gate insulating film 44 entirely provided onto the lower substrate 42 in a second mask process. The protective film 50 including a first to third contact holes 16, 30 and 38 is formed in a third mask process. The pixel electrode 18, the upper gate pad electrode 32 and the upper data pad electrode 40 are formed in a fourth mask process.

In such a method of fabricating the related art TFT array substrate, the source/drain pattern and the semiconductor pattern is simultaneously formed by a diffractive mask, so that line widths of the active layer 14 and the ohmic contact layer 48 are substantially wider than those of the source electrode 10 and the drain electrode 12.

This will be described in detail with reference to FIG. 3A to FIG. 3E showing sequentially a portion of the second mask process as follows.

Referring to FIG. 3A, the gate insulating film 44, an amorphous silicon layer 14a, an amorphous silicon layer doped with an $n^+$ impurity 48a, a source/drain metal layer 10a and a photo-resist 55 are sequentially formed on the lower substrate 42 provided with a gate pattern including the gate electrode 8, a gate line (not shown) and a gate pad by a deposition technique such as a Plasma Enhanced Chemical Vapor Deposition (PECVD) and sputtering, etc. A shielding portion is formed at an area corresponding to the source electrode 10 and the drain electrode 12 and a diffractive exposure mask having a diffractive exposure portion at an area corresponding to a channel of the thin film transistor is aligned onto the lower substrate 42.

Next, a photo-resist pattern 55a having a step coverage is formed on the source/drain metal layer 10a by a photolithography process using a second mask shown in FIG. 3B. The second mask employs a diffractive exposure mask having a diffractive exposure portion at an area corresponding to a channel of the TFT 6, so that the photo-resist pattern 55a formed at the channel of the TFT 6 may have a height lower than that of the photo-resist pattern 55a formed on the source/drain pattern.

Next, the source/drain metal layer 10a is patterned by a wet-etching process using the photo-resist pattern 55a as a mask to thereby provide the source/drain pattern including the data line 4, the source electrode 10 and the drain electrode 12 integral to the source electrode 10 shown in FIG. 3C.

The amorphous silicon layer 48a is patterned by a dry-etching process using the same photo-resist pattern 55a at the same time to thereby provide a semiconductor pattern including the ohmic contact layer 14 and the active layer 48.

Next, an ashing process is carried out, the photo-resist pattern 55a having a relatively low height at the channel of the TFT 6 is partially removed to thereby provide a photo-resist pattern 55a for exposing the source/drain metal corresponding to the channel of the TFT 6 as shown in FIG. 3D.

Herein, an ashing gas has a ratio of $O_2$ and $SF_6$ of about 20:1. But, if the photo-resist pattern 55a is ashed by such an ashing gas, then a thickness of the photo-resist pattern 55a as well as an edge A of the photo-resist pattern 55a is partially removed as shown in FIG. 3E. Accordingly, the photo-resist pattern 55a after the ashing process is carried out exposes an edge of the source/drain metal layer 10a.

And then, the source/drain pattern and the ohmic contact layer 48 of the channel of the TFT 6 exposed by the remaining photo-resist pattern 55a are etched by the dry-etching process. Thus, the active layer 14 is exposed to thereby separate the source electrode 10 from the drain electrode 12. Herein, the channel of the TFT 6 is formed and the edge A of the source/drain metal layer 10a is also etched, so that the line widths of the active layer 14 and the ohmic contact layer 48 are substantially wider than that of the source/drain pattern.

The photo-resist pattern 55a remaining on the source/drain pattern is removed by a stripping process to thereby provide the source electrode 10 and the drain electrode 12, and the ohmic contact layer 48 and the active layer 14 positioned at the lower portions of the source electrode 10 and the drain electrode 12.

The method of fabricating the related art TFT array substrate simultaneously forms the semiconductor pattern, the source electrode 10 and the drain electrode 12 using the diffractive exposure mask as a second mask, so that line widths of the active layer 14 and the ohmic contact layer 48 are substantially wider than those of the source electrode 10 and the drain electrode 12.

Accordingly, an area exists where the thin film patterns such as the gate electrode 8 and the gate line 2, where light is not shielded exists at a lower portion of the active layer 14 widely provided at lower portions of the source electrode 10 and the drain electrode 12, so that light irradiated from the back light is directly irradiated into the active layer 14.

Herein, if light is irradiated onto the active layer 14, then the active layer 14 is activated by the irradiated light to thereby create a channel, so that current flows into the TFT 6. Specially, if the active layer 14 provided at the lower drain electrode 12 of the TFT 6 is activated by the irradiated light, then the TFT 6 forms a channel by the activated active layer 14 such that the TFT 6 is not turned-on by a gate signal. In other words, the TFT 6 forms the channel regardless of driving of the TFT array substrate. Accordingly, a problem results in that current charged into the pixel electrode 18 by the channel regardless of driving of the TFT array substrate is leaked to the liquid crystal display device. Thus, picture quality of the liquid crystal display device may be deteriorated by current leakage.

SUMMARY OF THE INVENTION

Accordingly, the present invention is directed to a fabricating method for a thin film transistor array substrate and thin film transistor array substrate using the same that may prevent picture quality deterioration and that substantially obviates one or more problems due to limitations and disadvantages of the related art.

Additional features and advantages of the present invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the invention, as embodied and broadly described herein, a method of fabricating a thin film transistor array substrate comprises the steps of: Sequentially disposing a transparent conductive material and a metal material on a substrate; patterning with a first mask process the transparent conductive material and the metal material to provide a gate metal pattern including a gate line having a double layer structure including the transparent conductive material and the metal material, a gate electrode of a thin film transistor connected to the gate line, a gate pad extending from the gate line, a common line substantially parallel to the gate line and a common electrode substantially vertically extended from the common line and formed in a substantially finger structure, and forming a pixel electrode made from the transparent conductive material and providing a horizontal electric field along with the common electrode; sequentially disposing a first insulating material, a first semiconductor material and a second semiconductor material on a substrate provided with the gate metal pattern and the pixel electrode; patterning with a second mask process the first insulating material, the first semiconductor material and the second semiconductor material to provide a gate insulating film having a first contact hole exposing the pixel electrode, an active layer made from the first semiconductor material on the gate insulating film overlapping a gate electrode, and an ohmic contact layer made from the second semiconductor material on the active layer; patterning with a third mask process the source/drain metal material to provide a data metal pattern including a gate line crossing a data line and having the gate insulating film therebetween, a drain electrode contacted, via the first contact hole, with the pixel electrode, a source electrode separated with the drain electrode with having a channel of a thin film transistor therebetween and a data pad extending from the data line; entirely coating a second insulating material on a lower substrate provided with the data metal pattern; and patterning with a fourth mask process the second insulating material to provide a second contact hole for exposing the gate pad and a third contact hole for exposing the data pad.

The first mask may be a half-transmitting mask in which a shielding portion is formed at an area corresponding to the gate metal pattern and a half-transmitting portion formed at an area corresponding to the pixel electrode.

The second mask may be a half-transmitting mask in which a shielding portion is formed at an area corresponding to the active layer and the ohmic contact layer, and a half-transmitting portion is formed at an area corresponding to the gate insulating film other than an area provided with the active layer, the ohmic contact layer and the first contact hole.

The active layer may be formed at the same area where the gate electrode is formed or at an area substantially narrower than an area where the gate electrode is formed.

The third mask process may further include the step of removing an ohmic contact layer provided at the channel portion of the thin film transistor.

The fourth mask process may further include the step of removing a first insulating material provided at the third contact hole.

In another aspect, a thin film transistor array substrate comprises a gate line having a double layer structure including a transparent conductive layer and a metal layer disposed on a substrate; a data line crossing a gate line with a gate insulating film therebetween; a common electrode containing a common line substantially parallel to the gate line and having a double layer structure of the transparent conductive layer and the metal layer, and having a substantially finger portion substantially vertically-extended from the common line into a pixel area defined by an intersection of the gate line and the data line; a pixel electrode having a substantially finger portion which provides a horizontal electric field along with the common electrode at the pixel area, and made from the transparent conductive layer; a thin film transistor having a gate electrode connected to the gate line, a source electrode connected to the data line, a drain electrode separated from the source electrode with a channel of the thin film transistor therebetween and connected, via a first contact hole for exposing the pixel electrode, to the pixel electrode, and an active layer of a substantially island-shape for forming the channel of the thin film transistor and provided on the gate insulating film at an area overlapping the gate electrode; and a protective film for covering the data line, the source electrode and the drain electrode.

In the thin film transistor array substrate, said active layer may be formed at the same area where the gate electrode is formed or at a substantially narrower area than an area where the gate electrode is formed.

The thin film transistor array substrate may further include an ohmic contact layer for making ohmic contact with the source electrode and the drain electrode on the active layer of a substantially island-shape.

In the thin film transistor array substrate, said ohmic contact layer may be removed at a channel of the thin film transistor.

The thin film transistor array substrate may further include: a gate pad extending from the gate line; and a data pad extending from the data line.

The thin film transistor array substrate may further include a second contact hole passing through the gate insulating film and the protective film to expose the gate pad; and a third contact hole passing through the protective film to expose the data pad.

In another aspect, a method of fabricating a thin film transistor array substrate, comprises: patterning with a first mask process a transparent conductive material and a metal material to provide a gate metal pattern, a common line substantially parallel to the gate line and a common electrode substantially vertically-extended from the common line, and forming a pixel electrode made from the transparent conductive material wherein the first mask is a half-transmitting mask; sequentially disposing a first insulating material, a first semiconductor material and a second semiconductor material on a substrate provided with the gate metal pattern and the pixel electrode; patterning with a second mask process the first insulating material, the first semiconductor material and the second semiconductor material, an active layer made from the first semiconductor material, and an ohmic contact layer made from the second semiconductor material on the active layer wherein the second mask is a half transmitting mask; disposing a source/drain metal material on a substrate provide with the active layer and the ohmic contact layer; patterning with a third mask process the source/drain metal material to provide a data metal pattern; entirely coating a second insulating material on a lower substrate provided with the data metal pattern; and patterning with a fourth mask process the second insulating material.

It is understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

Figure 1:
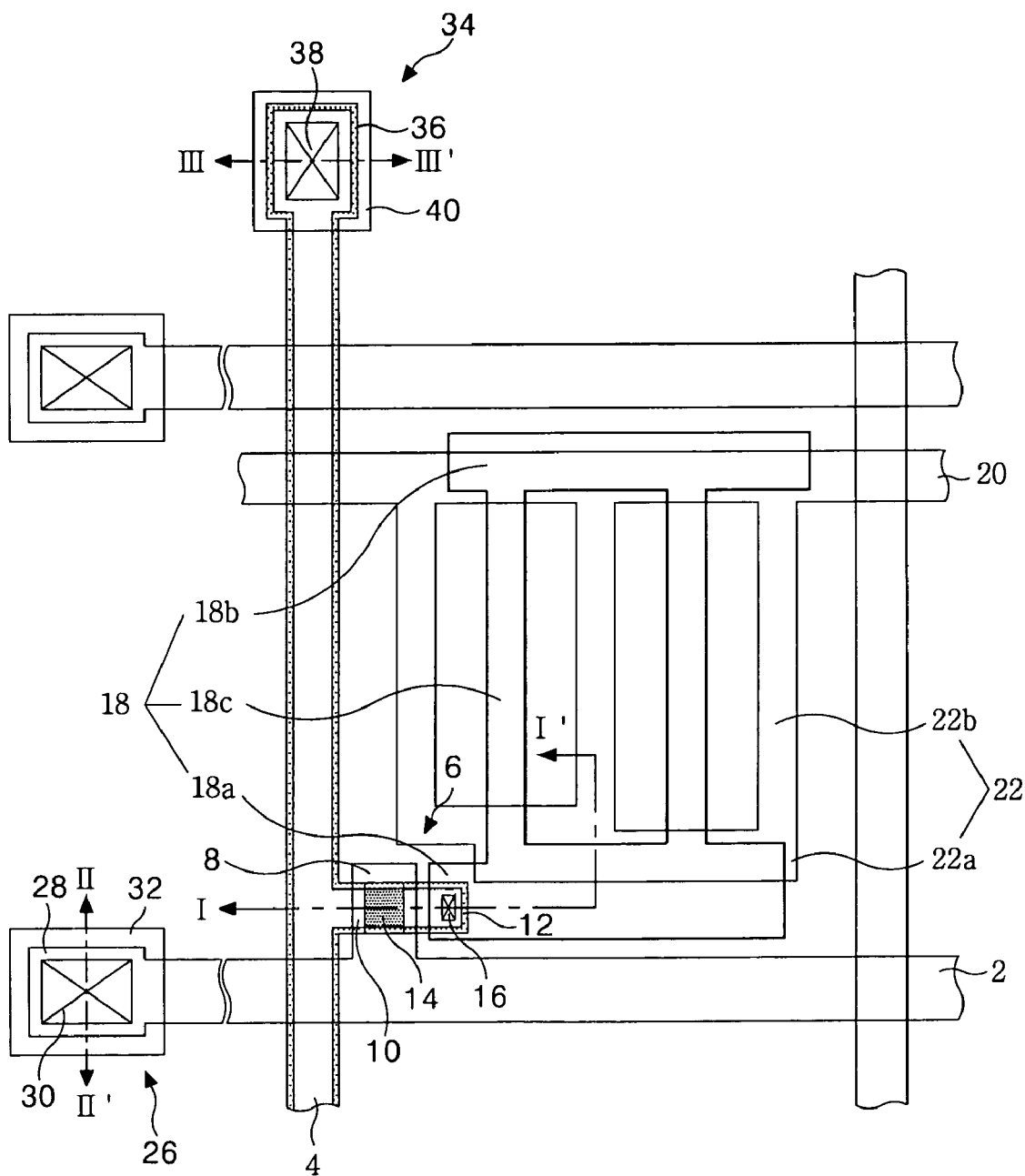
Figure 2:
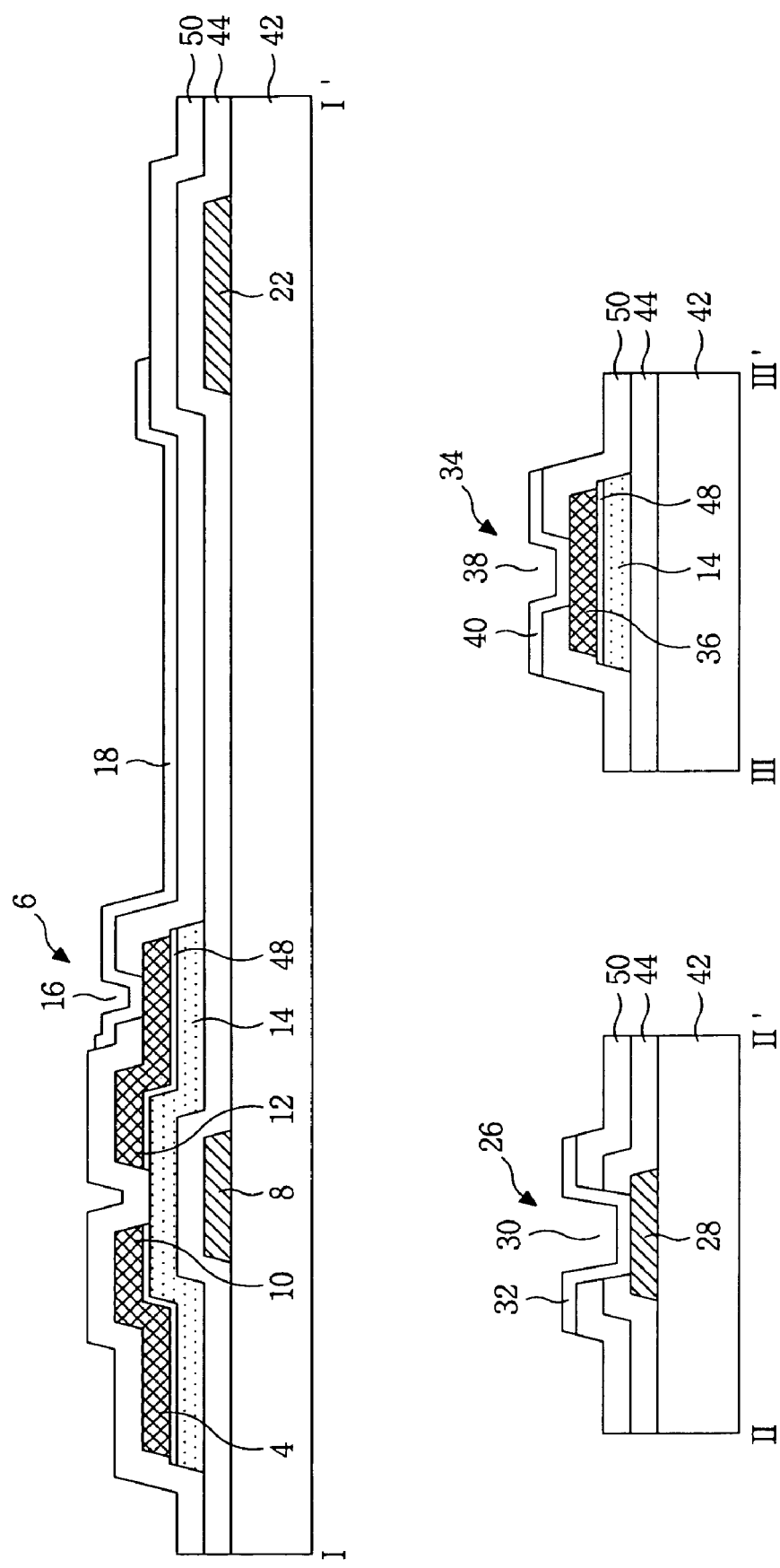
Figure 3A:
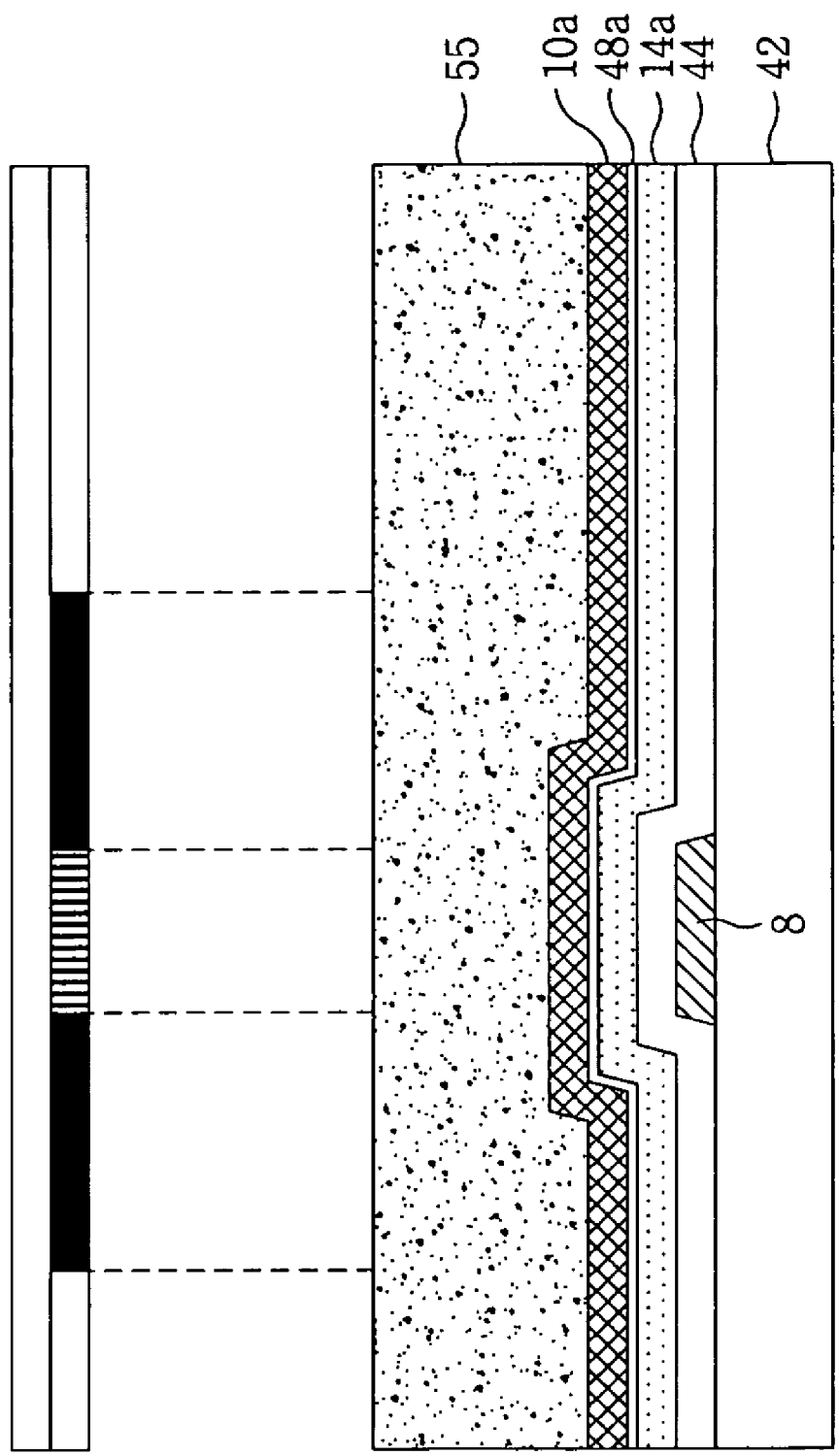
Figure 3B:
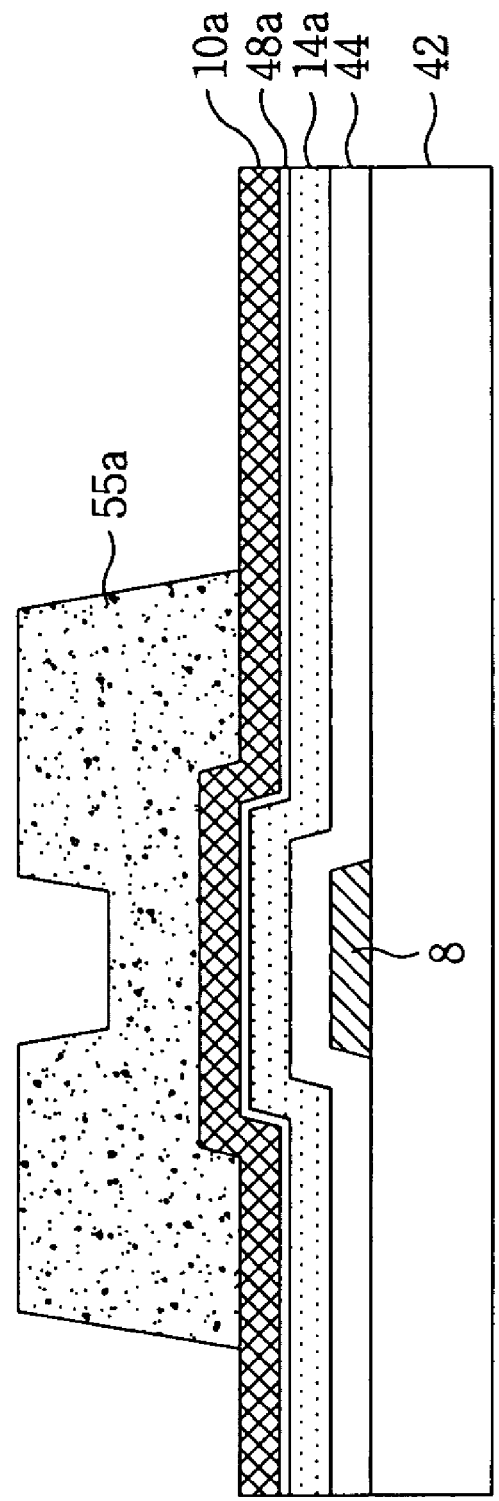
Figure 3C:
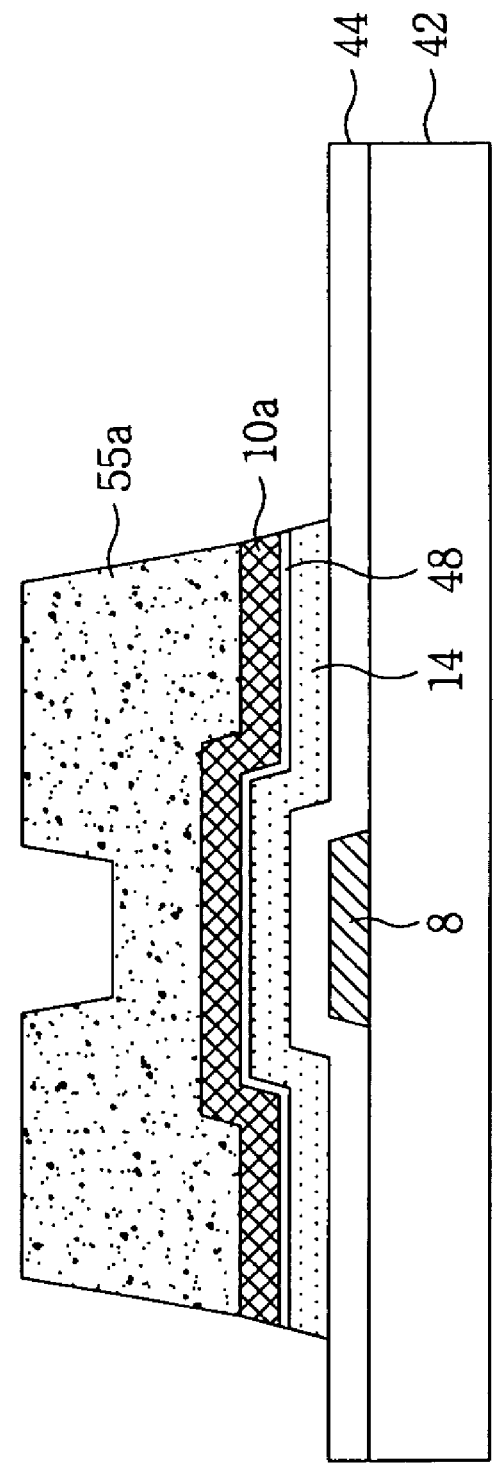
Figure 3D:
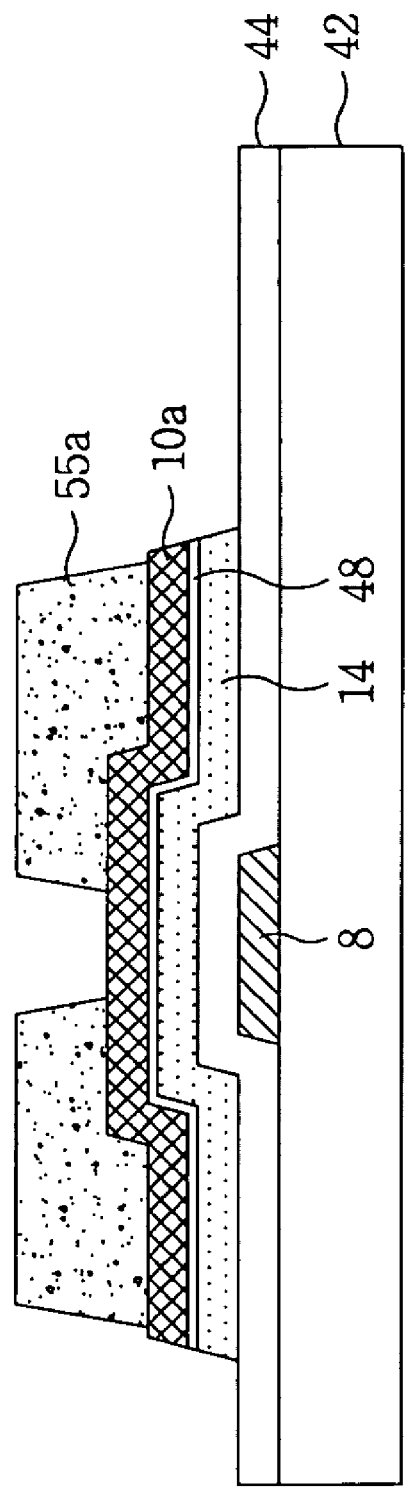
Figure 3E:
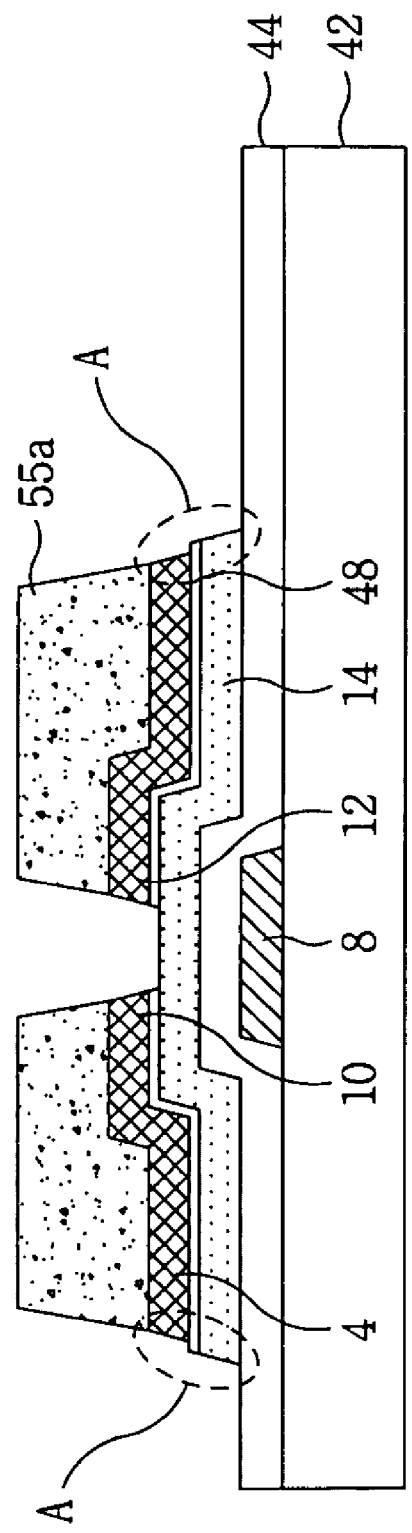
Figure 4:
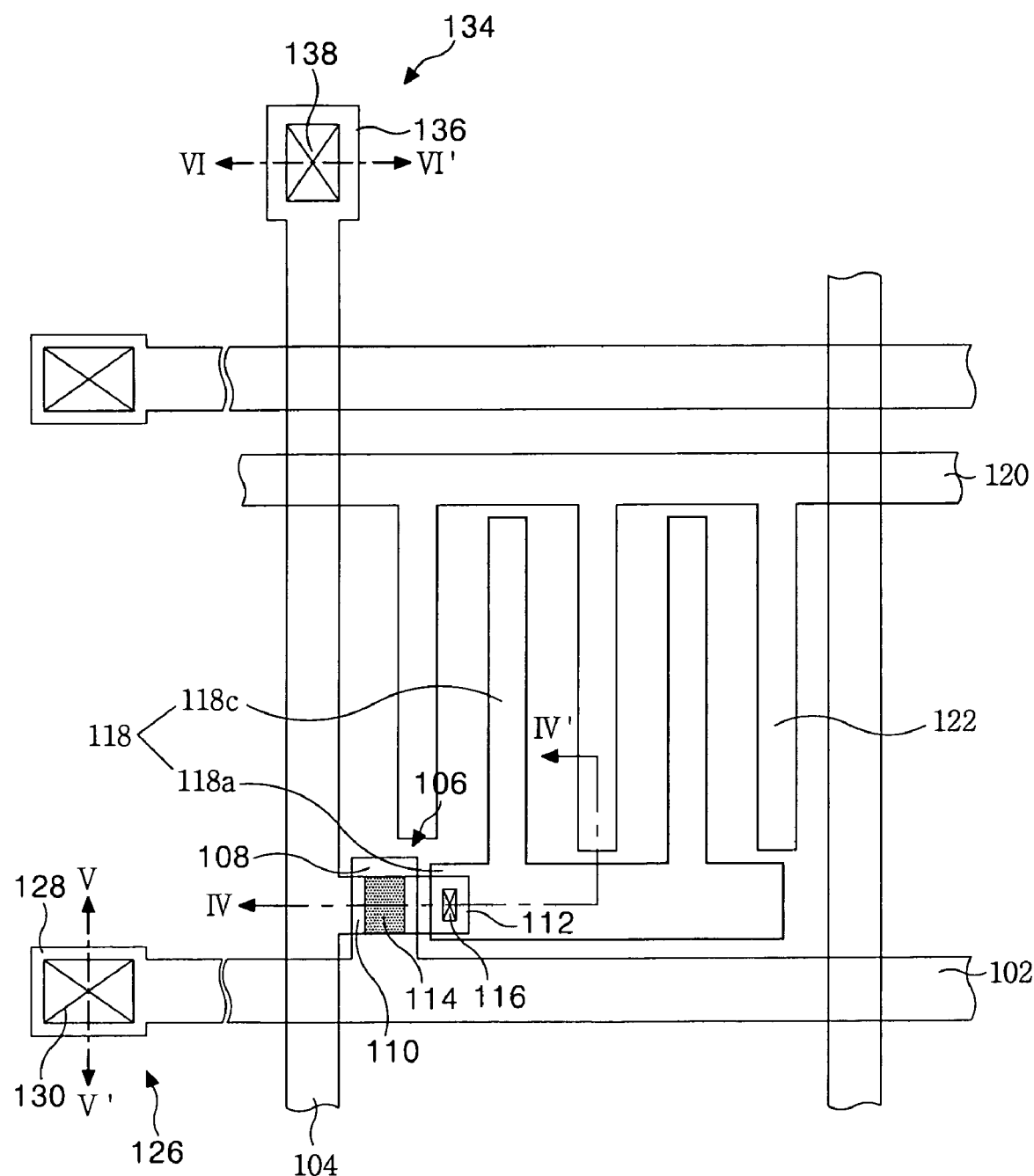
Figure 5:
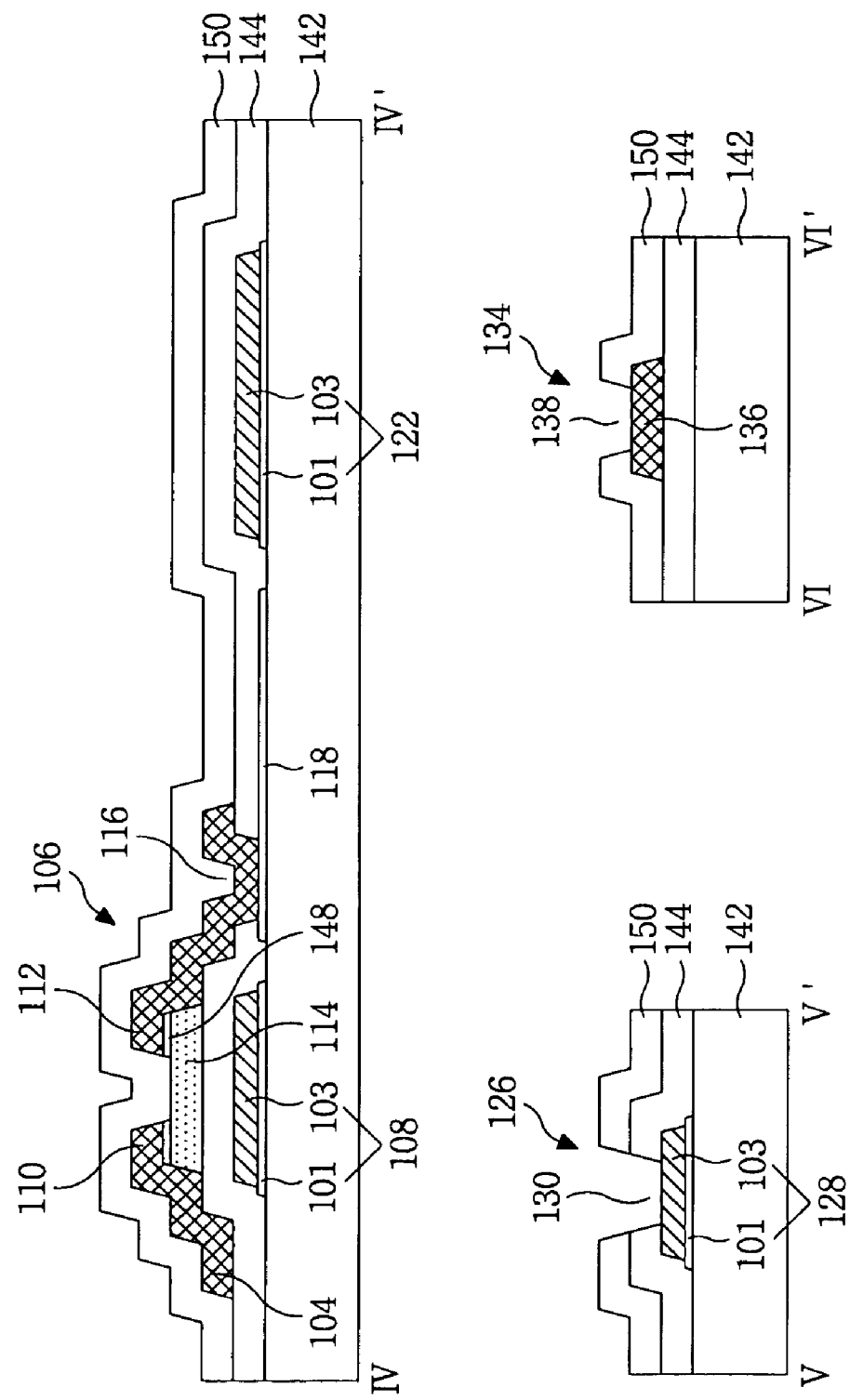
Figure 6A:
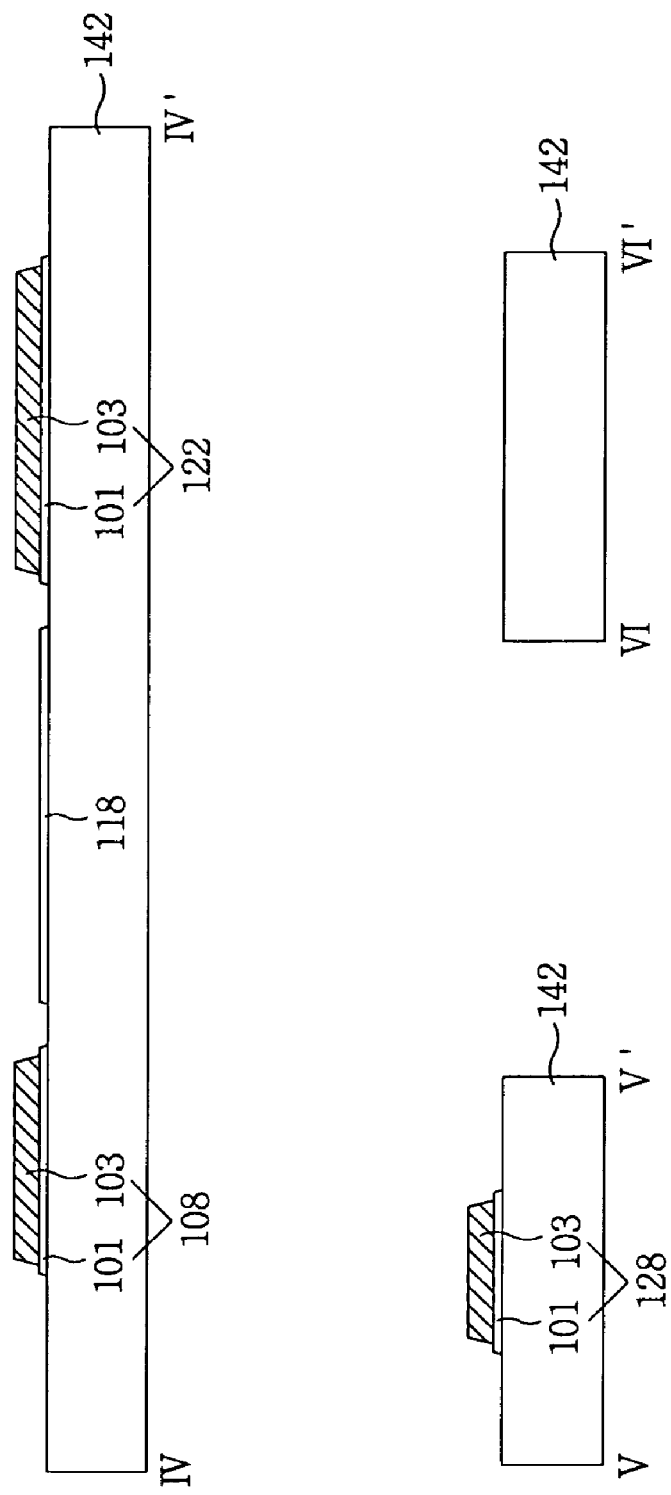
Figure 7A:
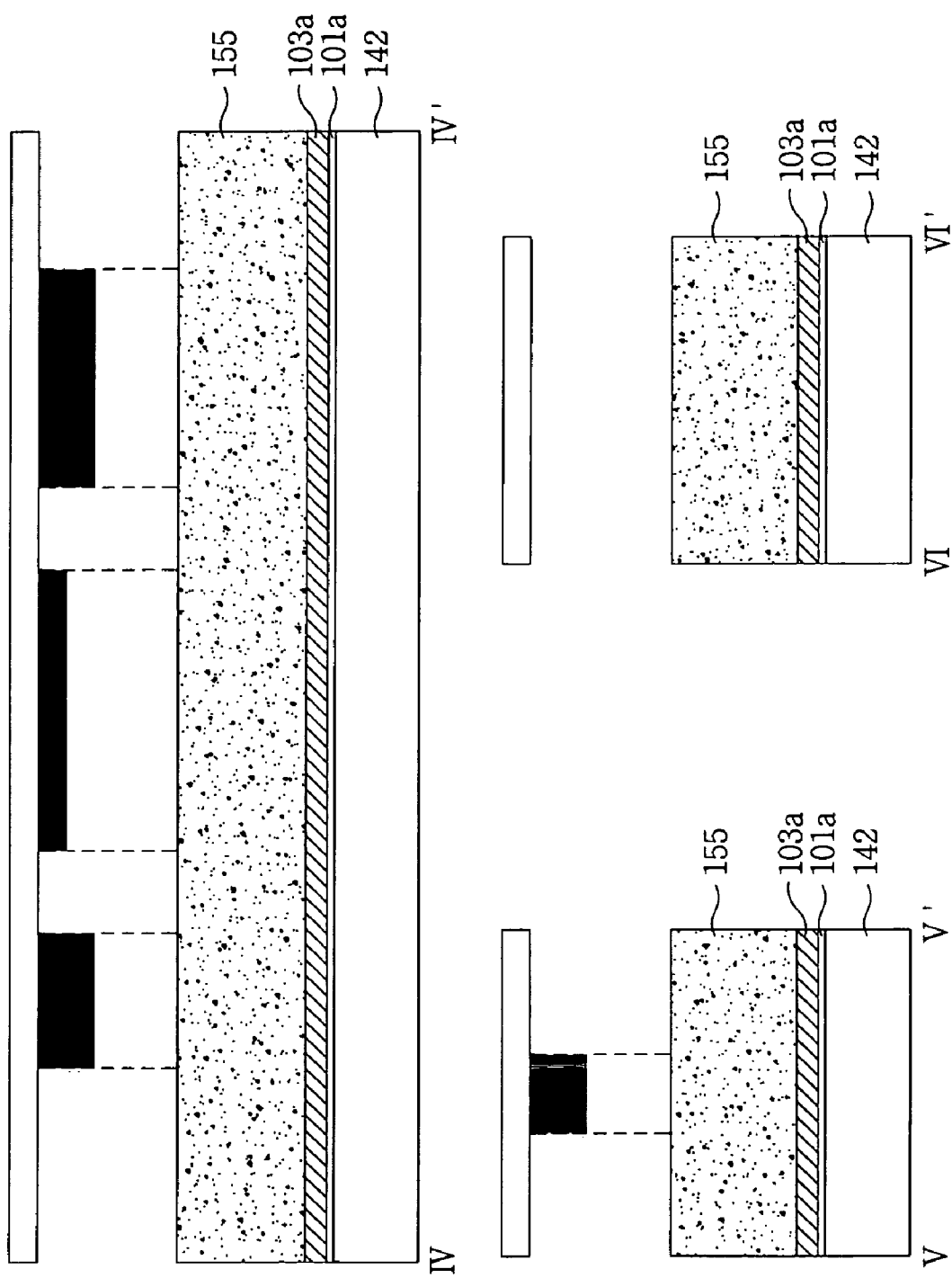
Figure 8A:
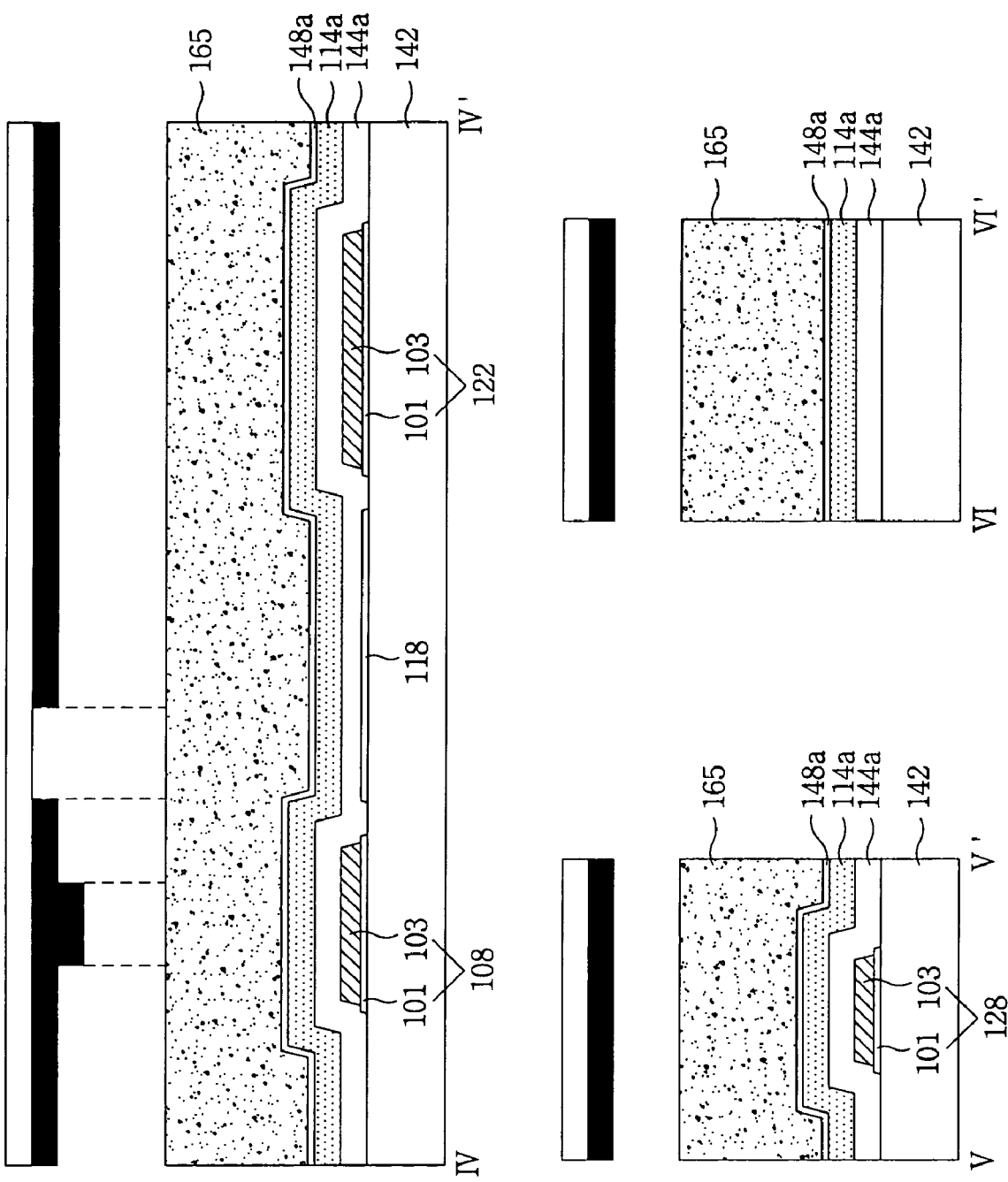

These and other advantages of the invention will be apparent from the following detailed description of the embodiments of the present invention with reference to the accompanying drawings:

FIG. 1 is a plan view showing a portion of a thin film transistor array substrate of a related art liquid crystal display device of horizontal electric field type;

FIG. 2 is a cross sectional view of the thin film transistor array substrate taken along lines I-I', II-II' and III-III' in FIG. 1;

FIG. 3A through and including FIG. 3E are sectional views showing a portion of a step by step second mask process of the related art thin film transistor array substrate;

FIG. 4 is a plan view showing a thin film transistor array substrate according to an embodiment of the present invention;

FIG. 5 is a cross sectional view of the thin film transistor array substrate taken along lines IV-IV', V-V' and VI-VI' line in FIG. 4;

FIG. 6A through and including FIG. 6D are cross sectional views showing a step by step method of fabricating the thin film transistor array substrate according to an embodiment of the present invention;

FIG. 7A through and including FIG. 7E are cross sectional views showing a step by step first mask process of the present invention; and FIG. 8A through and including FIG. 8E are cross sectional views showing a step by step second mask process of the present invention.

DETAILED DESCRIPTION OF THE ILLUSTRATED EMBODIMENTS

Reference will now be made in detail to embodiments of the present invention, examples of which are illustrated in the accompanying drawings.

Hereinafter, embodiments of the present invention will be described in detail with reference to FIG. 4 to FIG. 8E.

FIG. 4 is a plan view showing a thin film transistor array substrate according to an embodiment of the present invention, and FIG. 5 is a cross sectional view of the thin film transistor array substrate taken along the lines IV-IV', V-V' and VI-VI' in FIG. 4.

Referring to FIG. 4 and FIG. 5, the TFT array substrate of the liquid crystal display device of horizontal electric field type according to an embodiment of the present invention includes a gate line 102 and a data line 104 provided on a lower substrate 142 in such a manner to intersect each other with a gate insulating film 144 therebetween, a TFT 106 provided at each intersection of the gate line 102 and the data line 104, a pixel electrode 118 and a common electrode 122 formed such that a horizontal electric field is generated at a pixel area having a crossing structure of the gate line 102 and the data line 104, and a common line 120 connected to a common electrode 122. The TFT array substrate further includes a gate pad 126 connected to the gate line 102 and a data pad 134 connected to the data line 104.

The TFT 106 includes a gate electrode 108 connected to the gate line 102 and comprised of a transparent conductive layer 101 and a metal layer 103, a source electrode 110 connected to the data line 104, a drain electrode 112 connected to the pixel electrode 118, and an active layer 114 forming a channel between the source electrode 110 and the drain electrode 112 of a substantially island-shape at an area substantially overlapping the gate electrode 108. An ohmic contact layer 148 for making ohmic contact with the source electrode 110 and the drain electrode 112 is further formed on the active layer 114 of a substantially island-shape. Such a thin film transistor 106 allows a pixel voltage signal applied to the data line 104 to be charged into the pixel electrode 118 and kept in response to a gate signal applied to the gate line 102.

The pixel electrode 118 is connected, via a first contact hole 116 passing through the gate insulating film 144, to the drain electrode 112 of the TFT 106. Such a pixel electrode 118 is comprised of a substantially horizontal portion 118a substantially parallel to the gate line 102 and a finger portion 118c substantially extending from the horizontal portion 118a.

The common line 120 is substantially parallel to the gate line 102 and supplies a reference voltage for driving of a liquid crystal to the common electrode 122. The common line 120 is comprised of the transparent conductive layer 101 and the metal layer 103.

The common electrode 122 is substantially vertically extended from the common line 120 into a pixel area to thereby provide a horizontal electric field along with the finger portion 118c of the pixel electrode 118.

Accordingly, if a pixel voltage signal is supplied, via the TFT 106, to the pixel electrode 118 and a reference voltage is supplied, via the common line 120, to the common electrode 122, then a horizontal electric field is formed substantially between the finger portion 118c of the pixel electrode 118 and the common electrode 122. This liquid crystal display device rotates liquid crystal molecules positioned between the thin film transistor array substrate and the color filter array substrate owing to a dielectric anisotropy and transmits inputted light, via the pixel electrode 118, from a back light (not shown) toward the upper substrate to thereby display a picture.

The gate line 102 comprises the transparent conductive layer 101 and the metal layer 103, and is connected, via a gate pad 126, to a gate driver (not shown). The gate pad 126 includes a gate pad electrode 128 extending from the gate line 102, and is exposed, via a second contact hole 130 passing through the gate insulating film 144 and the protective film 150, to connect to the gate driver.

The data line 104 is connected, via a gate pad 134, to a data driver (not shown). The data pad 134 includes a data pad electrode 136 extending from the data line 104, and is exposed, via a third contact hole 138 passing through the protective film 150, to connect to the data driver.

Hereinafter, a method of fabricating a TFT array substrate according to embodiments of the present invention will be described with reference to FIG. 6A to FIG. 6D as follows.

Referring to FIG. 6A, in the method of fabricating the TFT array substrate according to an embodiment of the present invention, a transparent conductive material and a gate metal material are entirely disposed on the lower substrate 142 by the first mask process, and then patterned by photolithography and etching to provide gate patterns including the gate line 102 comprising the transparent conductive layer 101 and the metal layer 103, the gate electrode 108, the gate pad electrode 128, the common line 20 and the common electrode 122, and to provide the pixel electrode 118 made from the transparent conductive layer 101.

The first mask is a half-transmitting mask. Herein, the half-transmitting mask is comprised of a shielding portion at an area corresponding to the gate patterns, a half-transmitting portion positioned at an area corresponding to the pixel electrode 118, and a transmitting portion positioned at a different area.

Next, an insulating material is entirely coated on the lower substrate 142 provided with the gate patterns and the pixel electrode 118 and an amorphous silicon layer, an amorphous silicon layer doped with an n$^+$ impurity are sequentially entirely disposed by the second mask process, and then patterned by photolithography and etching to provide the gate insulating film 144 exposing the pixel electrode 118 via the first contact hole 116, the active layer 114 formed in a substantially island-shape overlapped with the gate electrode 108, and the ohmic contact layer 148 as shown in FIG. 6B. The active layer 114 and the ohmic contact layer 148 have substantially the same width as the gate electrode 108 have a width substantially narrower than that of the gate electrode 108.

The second mask is a half-transmitting mask. Herein, the half-transmitting mask is comprised of a shielding portion at an area corresponding to the active layer 114 and the ohmic contact layer 148, a transmitting portion positioned at an area corresponding to the first contact hole 116 for exposing the pixel electrode 118, and a half-transmitting portion positioned at a different area.

Figure 6C:
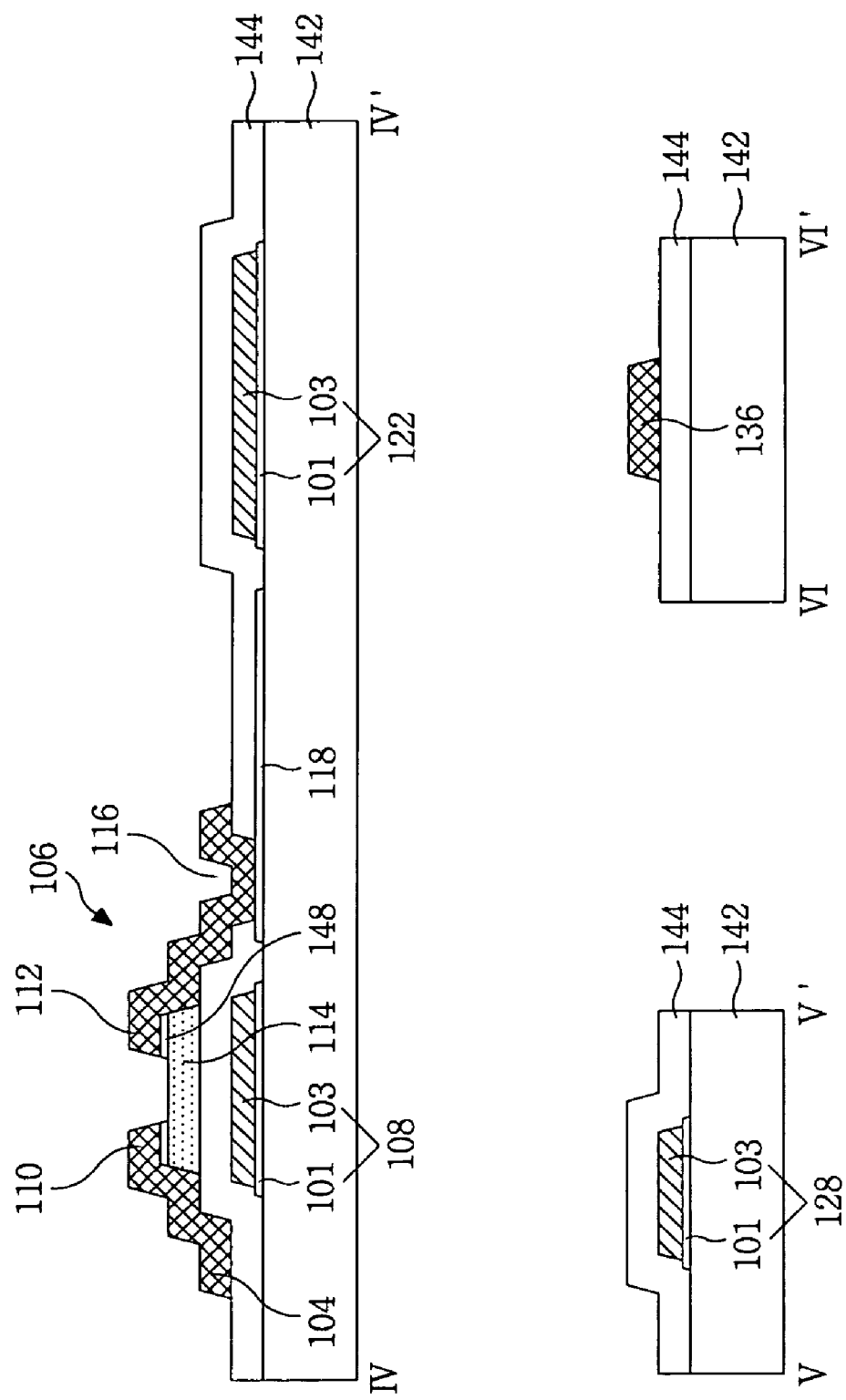

Next, the source/drain metal material is entirely disposed on the lower substrate 142 provided with the active layer 114 of a substantially island-shape and the ohmic contact layer 148 by the third mask process, and then patterned by photolithography and etching to provide the data line 104, the source electrode 110, the drain electrode and 112, and the data pad electrode 136. The drain electrode 112 is connected, via the first contact hole 116, to the pixel electrode as shown in FIG. 6C.

Next, an insulating material is entirely formed by the fourth mask process, and then patterned by photolithography and etching to provide the protective film 150 including the second contact hole 130 for exposing the gate pad electrode 128 and the third contact hole 138 for exposing the data pad electrode 136 as shown in FIG. 6D. The gate insulating film 144 of the second and the third contact holes 130 and 138 is patterned by the fourth mask process to thereby expose the gate pad electrode 128 and the data pad electrode 136, and the exposed gate pad electrode 128 and the exposed data pad electrode 136 are connected to the gate driver and the data driver (not shown), respectively.

As described above, the method of fabricating the TFT array substrate according to an embodiment of the present invention forms the active layer 114 of a substantially island-shape and the ohmic contact layer 148 overlapped with the gate electrode 108 using the second mask process, and forms the source electrode 110 and the drain electrode 112 using the third mask process different from the second mask process. Accordingly, the gate electrode 108 shields light irradiated from the back light such that light is not irradiated into the active layer 114 of the TFT array substrate of the present invention. Thus, the TFT 106 does not form a channel regardless of driving of the TFT array substrate, so that the TFT array substrate may remove a leakage of the pixel voltage signal charged into the pixel electrode 118. As a result, the TFT array substrate of the present invention may prevent picture quality deterioration of the liquid crystal display device.

Hereinafter, the first mask process and the second mask process of the present invention will be described in detail with reference to FIG. 7A to FIG. 8E as follows.

Referring to FIG. 7A, the first mask process sequentially disposes the transparent conductive material 101a and the metal material 103a on the lower substrate 142 using deposition techniques such as sputtering, for example.

A half-transmitting mask is aligned on the lower substrate 142. Herein, the half-transmitting mask is comprised of a shielding portion at an area corresponding to a gate metal pattern including the gate line (not shown), the gate electrode 108, the gate pad electrode 128, the common line 120 and the common electrode 122, and a half-transmitting portion at an area corresponding the pixel electrode 118.

A photo-resist pattern 155a having step coverage is formed on the metal material 103a by photolithography using the first mask as shown in FIG. 7B. The photo-resist pattern 155a formed on the pixel electrode 118 is of a height substantially lower than the photo-resist pattern 155a formed on the gate metal pattern.

Figure 7C:
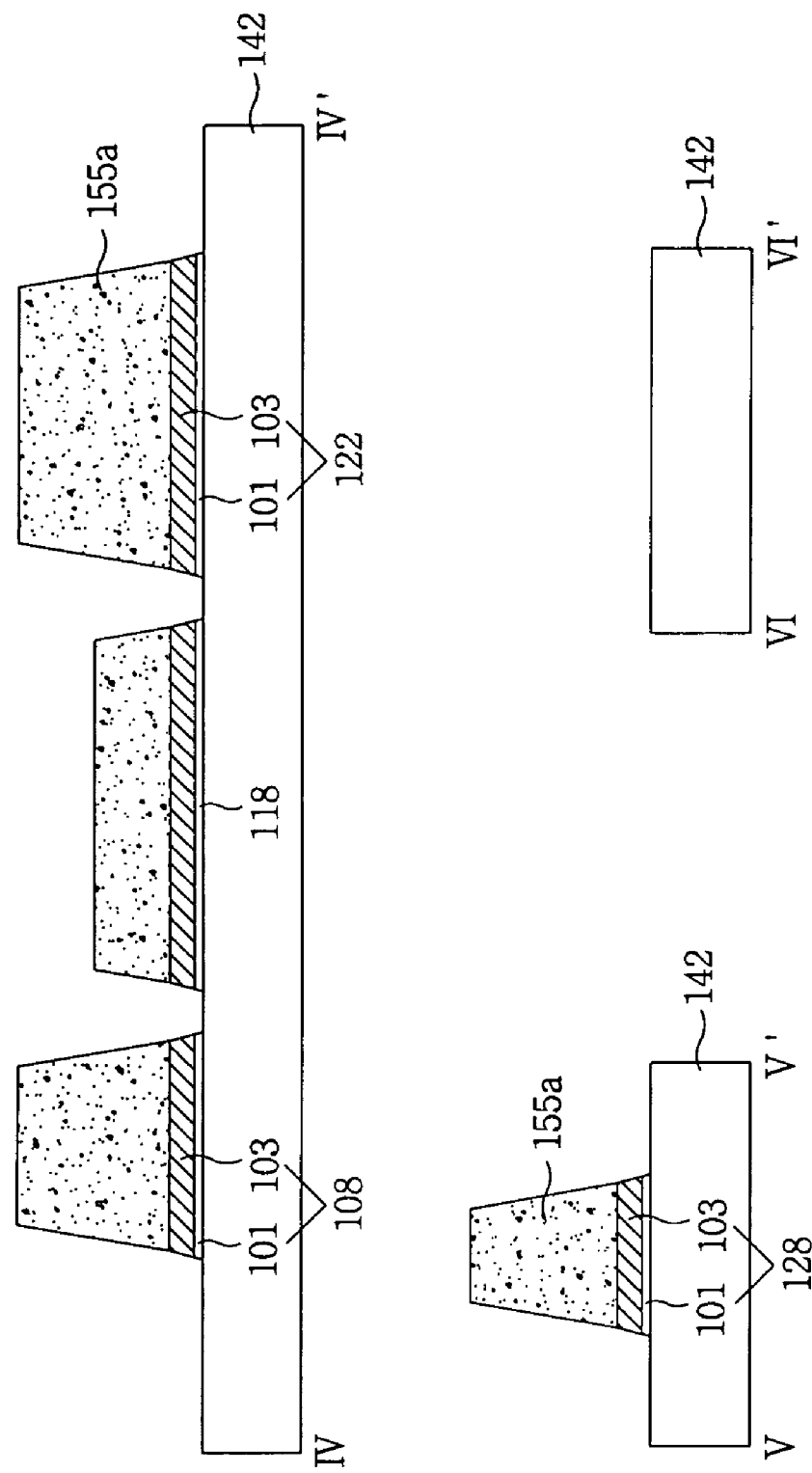

Next, the transparent conductive material 101a and the metal material 103a is patterned by wet-etching using the photo-resist pattern 155a as a mask to provide the pixel electrode 118 as shown in FIG. 7C. A photo-resist pattern having a relatively low height at the pixel electrode 118 is removed by an ashing process using $O_2$ plasma to thereby expose the metal material 103a formed on the pixel electrode 118 and forms the photo-resist pattern 155b of a height substantially lower at an area to be provided with the gate metal pattern as shown in FIG. 7D.

Next, the exposed metal material is patterned by wet-etching using the photo-resist pattern 155b which the height is lowered as a mask to thereby provide the gate patterns as shown in FIG. 7E.

The photo-resist pattern 155b remaining on the gate metal pattern is removed by stripping to provide the gate line (not shown), the gate electrode 108, the gate pad electrode 128, the common line 120 and the common electrode 122.

Also, the second mask process of the present invention entirely forms the gate insulating film 144a on the lower substrate 142 provided with the gate patterns and the pixel electrode 118, and an amorphous silicon layer 114a, an amorphous silicon layer doped with an $n^+$ impurity 148a are sequentially disposed on the gate insulating material 144a by the PECVD and sputtering, for example, as shown in FIG. 8A.

A half-transmitting mask is aligned on the lower substrate 142. Herein, the half-transmitting mask is comprised of a shielding portion at an area corresponding to a semiconductor pattern including the active layer 114 and the ohmic contact layer 148, and a half-transmitting portion at an area corresponding to the gate insulating film 144 other than the first contact hole 116.

Figure 8B:
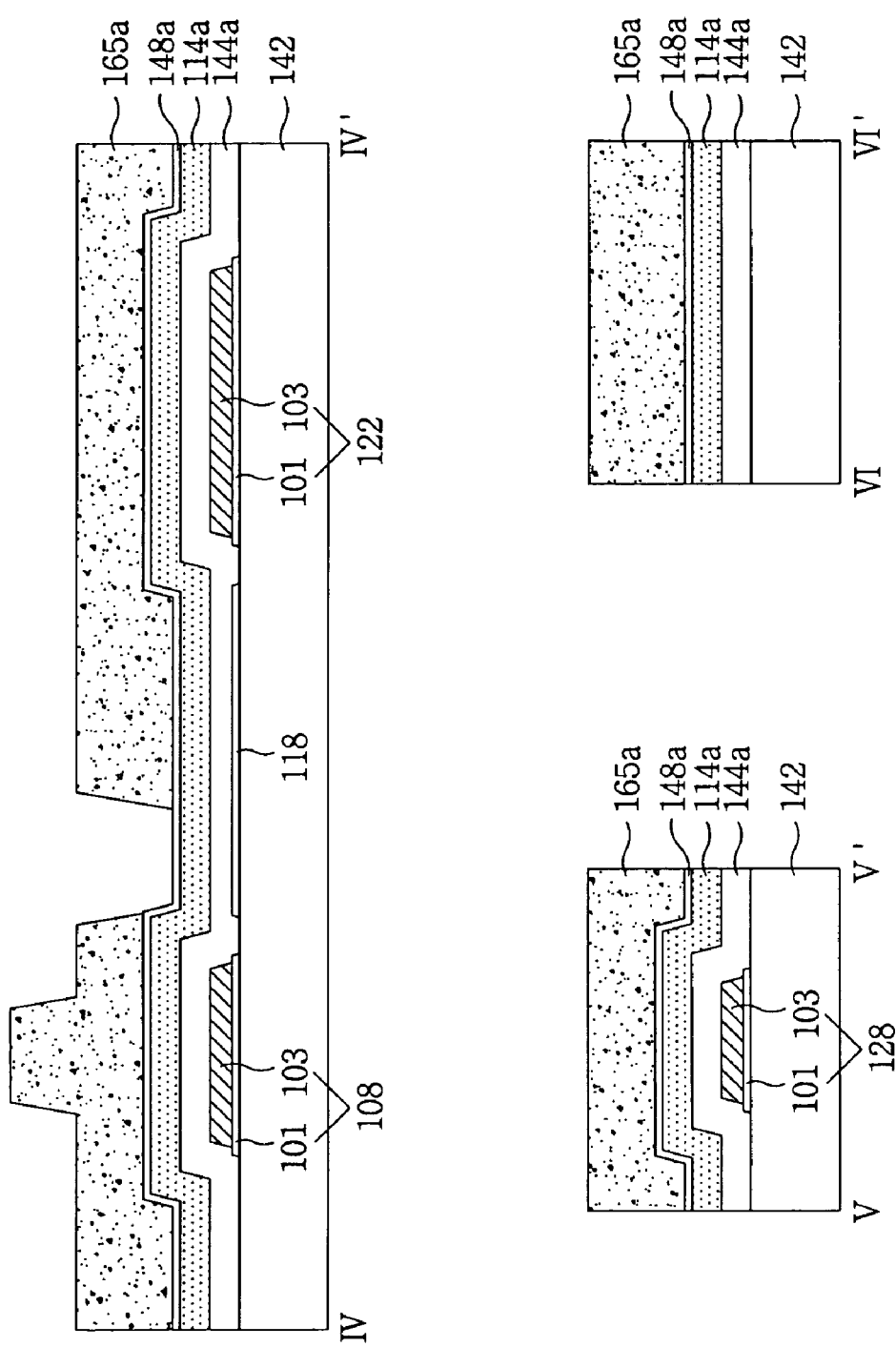

A photo-resist pattern 165a having step coverage is formed on the gate insulating material 144a by photolithography using the second mask as shown in FIG. 8B. The photo-resist pattern 165a formed on the gate insulating film 144 other than the first contact hole 116 has height substantially lower than the photo-resist pattern 165a formed on the semiconductor pattern.

Next, the first contact hole 116 is formed by dry-etching using the photo-resist pattern 165a as a mask as shown in FIG. 8C. A photo-resist pattern having a relatively low height at the gate insulating film 144 other than the first contact hole 116 is removed by the ashing process using $O_2$ plasma to provide the photo-resist pattern 165b which the height is lowered at an area corresponding to the semiconductor pattern as shown in FIG. 8D.

And, the amorphous silicon layer 114a, an amorphous silicon layer doped with an $n^+$ impurity 148a are patterned by dry-etching using the photo-resist pattern 165b which the height is lowered as a mask to provide the semiconductor pattern as shown in FIG. 8E.

The photo-resist pattern 165b left on the semiconductor pattern is removed by stripping to provide the active layer 114 and the ohmic contact layer 148.

As described above, the method of fabricating the thin film transistor array substrate and the thin film transistor array substrate using the same according to embodiments of the present invention forms the active layer of a substantially island-shape and the ohmic contact layer at an area overlapped with the gate electrode using the second mask process, and forms the source electrode and the drain electrode using the third mask process different from the second mask process. Accordingly, the gate electrode shields light irradiated from the back light so as not to irradiate light into the active layer of the TFT array substrate of the present invention. Thus, the TFT does not form a channel regardless of driving of the TFT array substrate, so that the TFT array substrate can remove a leakage of the pixel voltage signal charged into the pixel electrode. As a result, the TFT array substrate of the present invention may prevent picture quality deterioration of the liquid crystal display device.

It will be apparent to those skilled in the art that various modifications and variations can be made according to the present invention without departing from the spirit or scope of the invention. Thus, it is intended that the present invention cover the modifications and variations of this invention provided they come within the scope of the appended claims and their equivalents.

What is claimed is:

1. A method of fabricating a thin film transistor array substrate, comprising:
sequentially disposing a transparent conductive material and a metal material on a substrate;
with a first mask process using a first mask, patterning the transparent conductive material and the metal material to provide a gate metal pattern including a gate line, a gate electrode of a thin film transistor connected to the gate line, a gate pad extending from the gate line, a common line substantially parallel to the gate line and a common electrode substantially vertical-extended from the common line and formed in a substantially finger structure, and forming a pixel electrode providing a horizontal electric field along with the common electrode, wherein the gate line, the gate electrode, the gate pad, the common line and the common electrode have a double layer structure including the transparent conductive material and the metal material and wherein the pixel electrode is a single layer structure made from the transparent conductive material, wherein the first mask is a half-transmitting mask in which a shielding portion is formed at an area corresponding to the gate metal pattern and a half-transmitting portion is formed at an area corresponding to the pixel electrode;
sequentially disposing a first insulating material, a first semiconductor material and a second semiconductor material on the substrate provided with the gate metal pattern and the pixel electrode;
with a second mask process using a second mask, patterning the first insulating material, the first semiconductor material and the second semiconductor material to provide a gate insulating film having a first contact hole exposing the pixel electrode, an active layer made from the first semiconductor material on the gate insulating film overlapping with the gate electrode, and an ohmic contact layer made from the second semiconductor material on the active layer, wherein the active layer is formed above the gate electrode to have a same area as an area where the gate electrode is formed or a substantially narrower area than the area where the gate electrode is formed;
disposing a source/drain metal material on the substrate provided with the first contact hole, the active layer and the ohmic contact layer;
with a third mask process using a third mask, patterning the source/drain metal material to provide a data metal pattern including a data line crossing the gate line and having the gate insulating film therebetween, a drain electrode contacted, via the first contact hole, with the pixel electrode, a source electrode separated from the drain electrode with a channel of a thin film transistor therebetween and a data pad extending from the data line;
entirely coating a second insulating material on the substrate provided with the data metal pattern; and
with a fourth mask process using a fourth mask, patterning the second insulating material to provide a second contact hole for exposing the gate pad and a third contact hole for exposing the data pad.

2. The method of fabricating the thin film transistor array substrate as claimed in claim 1, wherein the second mask is a half-transmitting mask in which a shielding portion is formed at an area corresponding to the active layer and the ohmic contact layer, and a half-transmitting portion is formed at an area corresponding to an area of gate insulating film other than an area provided with the active layer, the ohmic contact layer and the first contact hole.

3. The method of fabricating the thin film transistor array substrate as claimed in claim 1, wherein the third mask process further includes the step of removing an ohmic contact layer provided on the channel portion of the thin film transistor.

4. The method of fabricating the thin film transistor array substrate as claimed in claim 1, wherein the fourth mask process further includes the step of removing the second insulating material provided at the third contact hole.

5. A method of fabricating a thin film transistor array substrate, comprising:
with a first mask process using a first mask, patterning a transparent conductive material and a metal material to provide a gate metal pattern including a gate line, a common line substantially parallel to the gate line and a common electrode substantially vertically-extended from the common line, and forming a pixel electrode on a substrate, wherein the gate line and the common line have a double layer structure including the transparent conductive material and the metal material and wherein the first mask is a half-transmitting mask so that the gate line and the common line have a double layer structure including the transparent conductive material and the metal material, and the pixel electrode has a single layer made from the transparent conductive material, wherein the first mask includes a shielding portion disposed at an area corresponding to the gate patterns and wherein a half-transmitting portion is positioned at an area corresponding to the common electrode and the pixel electrode, and a transmitting portion is positioned at a different area;
sequentially disposing a first insulating material, a first semiconductor material and a second semiconductor material on the substrate provided with the gate metal pattern and the pixel electrode;
with a second mask process using a second mask, patterning the first insulating material, the first semiconductor material and the second semiconductor material, and forming an active layer made from the patterned first semiconductor material, and an ohmic contact layer made from the patterned second semiconductor material on the active layer, wherein the second mask is a half transmitting mask and wherein the active layer is formed above the gate electrode to have a same area as an area where the gate electrode is formed or a substantially narrower area than an area where the gate electrode is formed;
disposing a source/drain metal material on the substrate, the active layer and the ohmic contact layer;
with a third mask process using a third mask, patterning the source/drain metal material to provide a data metal pattern;
entirely coating a second insulating material on the substrate provided with the data metal pattern; and
with a fourth mask process using a fourth mask, patterning the second insulating material.

6. The method of fabricating the thin film transistor array substrate as claimed in claim 5, wherein the second mask includes a shielding portion disposed at an area corresponding to the active layer and the ohmic contact layer and wherein a half-transmitting portion is positioned at an area corresponding to a first contact hole for exposing the pixel electrode, and a transmitting portion is positioned at a different area.

\* \* \* \* \*